US009859422B2

(12) United States Patent
Nishikawa et al.

(10) Patent No.: US 9,859,422 B2
(45) Date of Patent: Jan. 2, 2018

(54) FIELD EFFECT TRANSISTOR WITH ELEVATED ACTIVE REGIONS AND METHODS OF MANUFACTURING THE SAME

(71) Applicant: SANDISK TECHNOLOGIES, INC., Plano, TX (US)

(72) Inventors: Masatoshi Nishikawa, Yokkaichi (JP); Akira Inoue, Yokohama (JP); Fumiaki Toyama, Cupertino, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/723,868

(22) Filed: May 28, 2015

(65) Prior Publication Data
US 2016/0351709 A1  Dec. 1, 2016

(51) Int. Cl.
*H01L 29/78* (2006.01)
*H01L 29/417* (2006.01)
(Continued)

(52) U.S. Cl.
CPC .... *H01L 29/7834* (2013.01); *H01L 21/26513* (2013.01); *H01L 21/823418* (2013.01);
(Continued)

(58) Field of Classification Search
CPC ....... H01L 21/823418; H01L 27/11293; H01L 29/0847; H01L 29/66598; H01L 21/26513;
(Continued)

(56) References Cited

U.S. PATENT DOCUMENTS 5,915,167 A   6/1999  Leedy
6,127,233 A * 10/2000  Rodder ............. H01L 21/28114
                                                    257/E21.205
(Continued)

FOREIGN PATENT DOCUMENTS

WO    WO02/15277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Bitew Dinke
(74) *Attorney, Agent, or Firm* — The Marbury Law Group PLLC

(57) ABSTRACT

A field effect transistor having a higher breakdown voltage can be provided by forming a contiguous dielectric material layer over gate stacks, forming via cavities laterally spaced from the gate stacks, selectively depositing a single crystalline semiconductor material, and converting upper portions of the deposited single crystalline semiconductor material into elevated source/drain regions. Lower portions of the selectively deposited single crystalline semiconductor material in the via cavities can have a doping of a lesser concentration, thereby effectively increasing the distance between two steep junctions at edges of a source region and a drain region. Optionally, embedded active regions for additional devices can be formed prior to formation of the contiguous dielectric material layer. Raised active regions contacting a top surface of a substrate can be formed simultaneously with formation of the elevated active regions that are vertically spaced from the top surface.

12 Claims, 19 Drawing Sheets

(51) Int. Cl.

| | | |
|---|---|---|
| H01L 29/66 | (2006.01) | |
| H01L 29/08 | (2006.01) | |
| H01L 27/112 | (2006.01) | |
| H01L 21/8234 | (2006.01) | |
| H01L 21/265 | (2006.01) | |
| H01L 21/8238 | (2006.01) | |
| H01L 27/11529 | (2017.01) | |
| H01L 27/11556 | (2017.01) | |
| H01L 27/11573 | (2017.01) | |
| H01L 27/11582 | (2017.01) | |

(52) U.S. Cl.
CPC .............. *H01L 21/823475* (2013.01); *H01L 21/823814* (2013.01); *H01L 27/11293* (2013.01); *H01L 27/11529* (2013.01); *H01L 27/11556* (2013.01); *H01L 27/11573* (2013.01); *H01L 27/11582* (2013.01); *H01L 29/0847* (2013.01); *H01L 29/41783* (2013.01); *H01L 29/66598* (2013.01)

(58) Field of Classification Search
CPC ........... H01L 29/41783; H01L 29/7834; H01L 21/823814
See application file for complete search history.

(56) References Cited

U.S. PATENT DOCUMENTS

| | | | |
|---|---|---|---|
| 6,319,782 B1* | 11/2001 | Nakabayashi | H01L 29/41783 257/E21.429 |
| 6,323,525 B1* | 11/2001 | Noguchi | H01L 21/2257 257/344 |
| 7,005,350 B2 | 2/2006 | Walker et al. | |
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,394,716 B2 | 3/2013 | Hwang et al. | |
| 9,397,003 B1* | 7/2016 | Niimi | H01L 21/823418 |
| 2006/0157797 A1* | 7/2006 | Tateshita | H01L 21/28114 257/369 |
| 2007/0155074 A1* | 7/2007 | Ho | H01L 21/28035 438/197 |
| 2007/0210338 A1 | 9/2007 | Orlowski | |
| 2007/0221998 A1* | 9/2007 | Park | H01L 27/105 257/382 |
| 2007/0252201 A1 | 11/2007 | Kito et al. | |
| 2008/0096328 A1 | 4/2008 | Chol et al. | |
| 2008/0116583 A1 | 5/2008 | Yuki | |
| 2009/0230449 A1 | 9/2009 | Sakaguchi et al. | |
| 2009/0242967 A1 | 10/2009 | Katsumata et al. | |
| 2010/0044778 A1 | 2/2010 | Seol | |
| 2010/0090286 A1 | 4/2010 | Lee et al. | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0233688 A1 | 9/2011 | Ren et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0119287 A1 | 5/2012 | Park et al. | |
| 2012/0168877 A1* | 7/2012 | Mukherjee | H01L 29/66446 257/401 |
| 2012/0261756 A1* | 10/2012 | Kanike | H01L 27/1211 257/350 |
| 2012/0280290 A1* | 11/2012 | Khakifirooz | H01L 27/0207 257/288 |
| 2013/0140669 A1* | 6/2013 | Yugami | H01L 21/76224 257/506 |
| 2013/0161746 A1* | 6/2013 | Posseme | H01L 29/78696 257/347 |
| 2013/0181264 A1* | 7/2013 | Liao | H01L 29/785 257/288 |
| 2013/0217190 A1* | 8/2013 | Jagannathan | H01L 29/4908 438/151 |
| 2013/0264631 A1 | 10/2013 | Alsmeier et al. | |
| 2013/0309852 A1* | 11/2013 | Kanakasabapathy | H01L 21/28008 438/585 |
| 2013/0320417 A1* | 12/2013 | Mukherjee | H01L 29/401 257/288 |
| 2014/0117421 A1* | 5/2014 | Seo | H01L 21/823418 257/288 |
| 2014/0154846 A1* | 6/2014 | Cheng | H01L 29/66772 438/151 |
| 2015/0008520 A1* | 1/2015 | Cheng | H01L 27/1207 257/347 |
| 2015/0064863 A1* | 3/2015 | Adusumilli | H01L 21/283 438/229 |
| 2015/0206945 A1* | 7/2015 | Chen | H01L 29/41783 257/384 |
| 2015/0214058 A1* | 7/2015 | Basker | H01L 21/283 257/769 |
| 2015/0364490 A1* | 12/2015 | Oda | H01L 21/26513 257/351 |
| 2015/0372100 A1* | 12/2015 | Zschtzsch | H01L 29/41725 257/384 |
| 2016/0163702 A1* | 6/2016 | Wu | H01L 27/0922 257/369 |
| 2016/0260712 A1* | 9/2016 | Yagishita | H01L 27/088 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Dec. 19, 2013, SanDisk Technologies Inc.

(56) References Cited

OTHER PUBLICATIONS

U.S. Appl. No. 14/517,134, filed Oct. 17, 2014, SanDisk Technologies Inc.

International Search Report and Written Opinion of the International Searching Authority for PCT/US2016/028473, date Jul. 8, 2016, 16 pages.

Ishitani, A. et al., "Local Loading Effect in Selective Silicon Epitaxy," Japanese Journal of Applied Physics, vol. 23, No. 6, pp. L391-L393, (Jun. 1984).

* cited by examiner

FIELD EFFECT TRANSISTOR WITH ELEVATED ACTIVE REGIONS AND METHODS OF MANUFACTURING THE SAME

FIELD

The present disclosure generally relates to semiconductor devices, and particularly to field effect transistors having elevated active regions and methods of manufacturing the same.

BACKGROUND

The breakdown characteristics of field effect transistors are affected by the proximity of the steepness of the junction profile. In general, the closer the active regions to the gate electrode, the lower the breakdown voltage for the field effect transistor. In other words, the greater the distance between a proximal edge of a gate electrode and an adjacent heavily doped semiconductor region (which is a source region or a drain region), the greater the breakdown voltage of the field effect transistor. However, the increase in the distance between the gate electrodes and the active regions increase the size of the field effect transistor and decreases device density, thereby increasing the manufacturing cost per device.

SUMMARY

According to an aspect of the present disclosure, a semiconductor structure is provided. The semiconductor structure comprises a gate dielectric and a gate electrode overlying a channel of a first field effect transistor; a contiguous dielectric material layer laterally surrounding the gate electrode; a first source-side via cavity extending from a bottom surface of the contiguous dielectric material layer to a top surface of the contiguous dielectric material layer; a first drain-side via cavity extending from the bottom surface of the contiguous dielectric material layer to the top surface of the contiguous dielectric material layer; a first source region located within the first source-side via cavity; and a first drain region located within the first drain-side via cavity. Each of the first source region and the first drain region has a bottom surface located above, and vertically spaced from, the bottom surface of the contiguous dielectric material layer.

According to another aspect of the present disclosure, a method of forming a semiconductor structure is provided. At least one gate stack is formed over a semiconductor substrate. A contiguous dielectric material layer is formed over the substrate. The contiguous dielectric material layer laterally surrounds each of the at least one gate stack. A pair of first via cavities is formed adjacent to a first gate stack among the at least one gate stack and through the contiguous dielectric material layer. Each of the pair of first via cavities extends from a top surface of the contiguous dielectric material layer to a top surface of the semiconductor substrate. A pair of first epitaxial pillar structures is formed at lower portions of the pair of first via cavities. Electrical dopants are implanted into upper portions of the pair of epitaxial pillar structures. A first source region and a first drain region are formed in implanted portions of the pair of first epitaxial pillar structures.

DETAILED DESCRIPTION

As discussed above, the present disclosure is directed to field effect transistors having elevated active regions and methods of manufacturing the same, the various aspects of which are described below. The embodiments of the disclosure can be employed to form various semiconductor structures including field effect transistors. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

Figure 1:
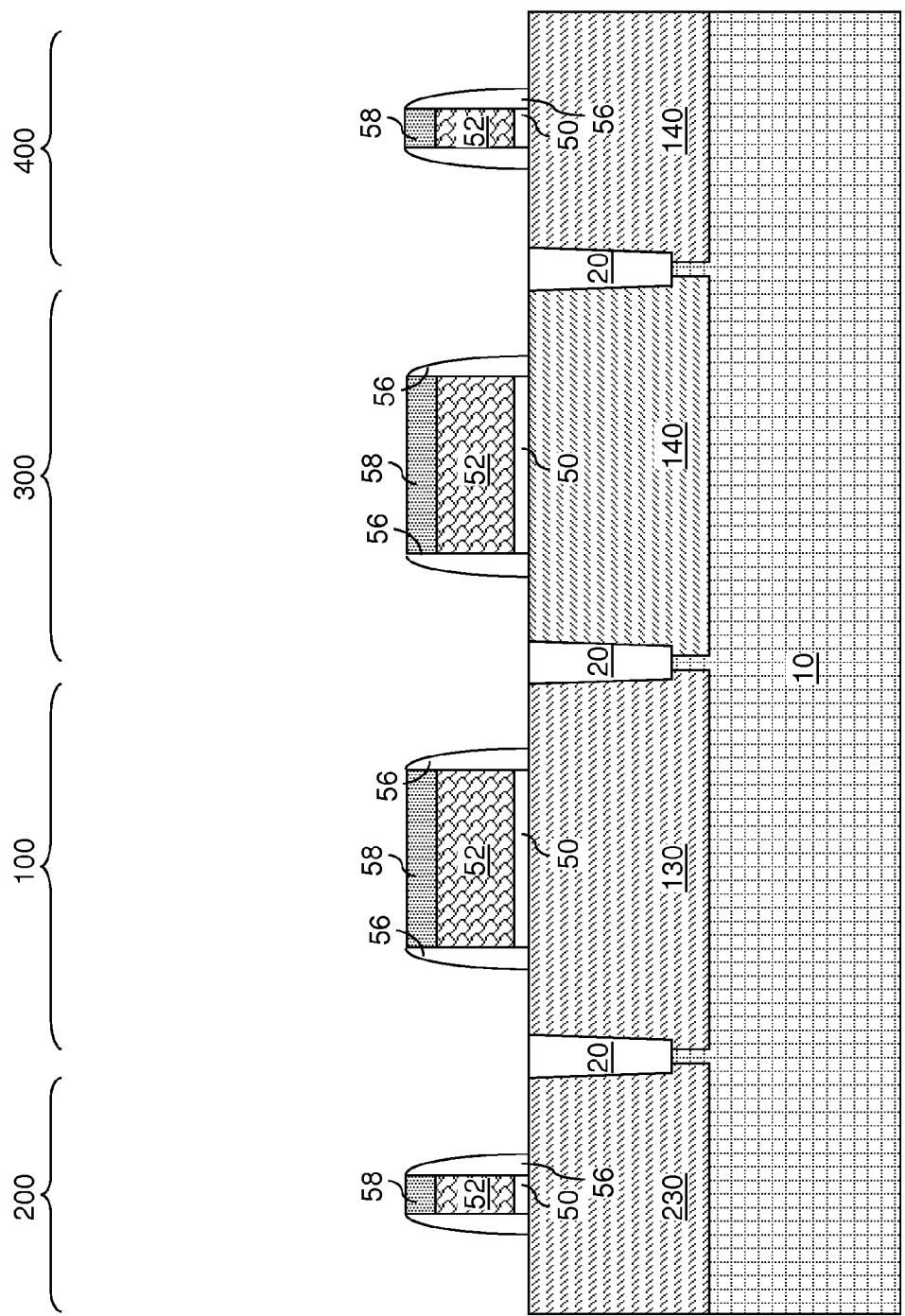
FIG. 1 is a vertical cross-sectional view of an exemplary semiconductor structure after formation of gate stacks and gate spacers according to an embodiment of the present disclosure.

Referring to FIG. 1, an exemplary semiconductor structure is illustrated. The exemplary semiconductor structure comprises a substrate including a semiconductor material layer 10. The semiconductor material layer 10 can include at least one elemental semiconductor material, at least one III-V compound semiconductor material, at least one II-VI compound semiconductor material, at least one organic semiconductor material, or other semiconductor materials known in the art. The semiconductor material layer 10 can be a single crystalline semiconductor material layer. In one embodiment, the semiconductor material layer 10 can be a single crystalline silicon layer.

The semiconductor material layer 10 may be initially formed as a layer having a uniform thickness. The semiconductor material layer 10 can be a semiconductor substrate (i.e., a bulk semiconductor substrate), or can be a portion of a substrate. In case the semiconductor material layer 10 is an uppermost layer of a substrate including at least one underlying material layer, the at least one underlying material layer can include another semiconductor material layer and/or an insulator layer and/or a conductive material layer. For example, the semiconductor material layer 10 can be a strained or relaxed semiconductor material layer with epitaxial alignment with an underlying semiconductor material layer having a different lattice constant than the semiconductor material layer 10. Alternately, the semiconductor material layer 10 can be a top semiconductor layer in a semiconductor-on-insulator (SOI) substrate. The semiconductor material layer 10 can be intrinsic, p-doped, or n-doped. If p-doped or n-doped, the semiconductor material layer 10 can have a dopant concentration in a range from $1.0 \times 10^{14}/cm^3$ to $1.0 \times 10^{18}/cm^3$, although lesser and greater dopant concentrations can also be employed.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition.

Optionally, at least one doped semiconductor well (130, 230, 140, 240) can be formed within the semiconductor material layer 10, for example, by implanting electrical dopants of various conductivity types into surface portions of the semiconductor material layer 10. Patterned photoresist layers (not shown) can be employed as masking layers during various ion implantation processes. Each patterned photoresist layer can be formed prior to a respective ion implantation process, and can be removed, for example, by ashing after the respective ion implantation process. The electrical dopants can include p-type dopants and n-type dopants. Each implanted portion of the semiconductor material layer 10 can be converted into a doped semiconductor well (130, 230, 140, 240). Each doped semiconductor well (130, 230, 140, 240) can be p-doped, or n-doped, and can have a dopant concentration in a range from $1.0 \times 10^{15}/cm^3$ to $1.0 \times 10^{19}/cm^3$, although lesser and greater dopant concentrations can also be employed. While the present disclosure is described employing four doped semiconductor wells, embodiments are expressly contemplated in which one or more of the four doped semiconductor wells and devices thereupon are omitted.

In an illustrative example, the at least one doped semiconductor well (130, 230, 140, 240) can comprise a first doped semiconductor well 130 located in a first device region 100, a second doped semiconductor well 230 located in a second device region 200, a third doped semiconductor well 140 located in a third device region 300, and a fourth doped semiconductor well 240 located in a fourth device region 400. In one embodiment. The first doped semiconductor well 130 and the second doped semiconductor well 230 can have a doping of a first conductivity type, and the third doped well 140 and the fourth doped semiconductor well 240 can have a doping of a second conductivity type that is the opposite of the first conductivity type. In one embodiment, the first conductivity type can be p-type and the second conductivity type can be n-type. Alternatively, the first conductivity type can be n-type and the second conductivity type can be p-type.

Optionally, shallow trench isolation structures 20 can be formed to provide electrical isolation among devices to be subsequently formed. In one embodiment, the shallow trench isolation structures 20 can be formed at boundaries among the doped semiconductor wells (130, 230, 140, 240).

Gate stack layers are formed on the top surface of the substrate. The gate stack layers can include, for example, a gate dielectric layer, a gate conductor layer, and a gate cap dielectric layer. Optionally, a plurality of gate dielectric layers may be formed employing patterning steps to provide various gate dielectric portions having different thicknesses across the various device regions (100, 200, 300, 400). The gate conductor layer includes at least one conductive material such as a doped semiconductor material, a metallic material, and/or a metal-semiconductor alloy. For example, the gate conductor layer can include a stack, from bottom to top, of a doped semiconductor layer, a conductive metallic nitride layer (such as a tungsten nitride layer), and a metal layer (such as a tungsten layer). Optionally, the gate conductor layer may be formed to provide different layer stacks across different device regions (100, 200, 300, 400) to optimize device performance. The gate cap dielectric layer includes at least one dielectric material such as silicon oxide, silicon nitride, organosilicate glass, or a combination thereof.

The gate stack layers can be patterned into gate stacks (50, 52, 58) by applying a photoresist layer over the gate stack layers, lithographically patterning the photoresist layer, and transferring the pattern of the photoresist layer into the gate stack layers employing at least one etch process, which can include at least one anisotropic etch process. Each remaining portion of the gate dielectric layer constitutes a gate dielectric 50, each remaining portion of the gate conductor layer constitutes a gate electrode 52, and each remaining portion of the gate cap dielectric layer constitutes a gate cap dielectric 58. A stack of a gate dielectric 50, a gate electrode 52, and a gate cap dielectric 58 constitutes a gate stack (50, 52, 58). At least one gate stack (50, 52, 58) can be formed in each device region (100, 200, 300, 400).

Optionally, electrical dopants can be implanted employing masked ion implantation processes. In one embodiment, the masked ion implantation processes can be performed to form extended active regions in the second and fourth device regions (200, 400). As used herein, "extended active regions" collectively refer to source extension regions and drain extension regions. As used herein, a "source extension region" refers to a region contacting a source region having a same type of doping as the source region, and having at least one of a lower dopant concentration than the source region and a lesser thickness than the source region. As used herein, a "drain extension region" refers to a region contacting a drain region having a same type of doping as the drain region, and having at least one of a lower dopant concentration than the drain region and a lesser thickness than the drain region. As used herein, a "source region" refers to a region that provides charge carriers that pass through a channel of a field effect transistor. Thus, the source region has a doping of the same conductivity type as the charge carriers that pass through the channel. The source region can have a doping of an opposite conductivity type than the channel of the field effect transistor. For example, if the charge carriers in the channel are electrons, the source region can have an n-type doping, and if the charge carriers in the channel are holes, the source region can have a p-type doping. As used herein, a "drain region" refers to a region into which the charge carriers that pass through a channel of a field effect transistor flow into. The drain region can have a doping of an opposite conductivity type than the channel of the field effect transistor. As used herein, "active regions" collectively refer to source regions and drain regions.

Optionally, a gate spacer 56 can be formed around each gate stack (50, 52, 58). The gate spacers 56 include at least one dielectric material such as silicon oxide, silicon nitride, silicon oxynitride, organosilicate glass, or a combination thereof.

P-type dopants and/or n-type dopants can be implanted employing implantation masks to provide suitable doping to selected surface portions of the of the doped semiconductor wells (130, 230, 140, 240). For example, lightly doped source/drain regions (not shown) can be formed in surface portions of the first doped semiconductor well 130 and the third doped semiconductor well 140. In one embodiment, each lightly doped source/drain region can have a doping of the opposite conductivity type from the conductivity type of the doped semiconductor well in which the respective lightly doped source/drain region is embedded. The net dopant concentration (i.e., the concentration of the majority dopants less the concentration of the minority dopants) in the lightly doped source/drain regions can be in a range from $1.0 \times 10^{14}$/cm$^3$ to $1.0 \times 10^{17}$/cm$^3$, although lesser and greater net dopant concentrations can also be employed. If present, the lightly doped source/drain regions can improve the breakdown immunity of the field effect transistors between a source region and a drain region that are subsequently formed.

Figure 2:
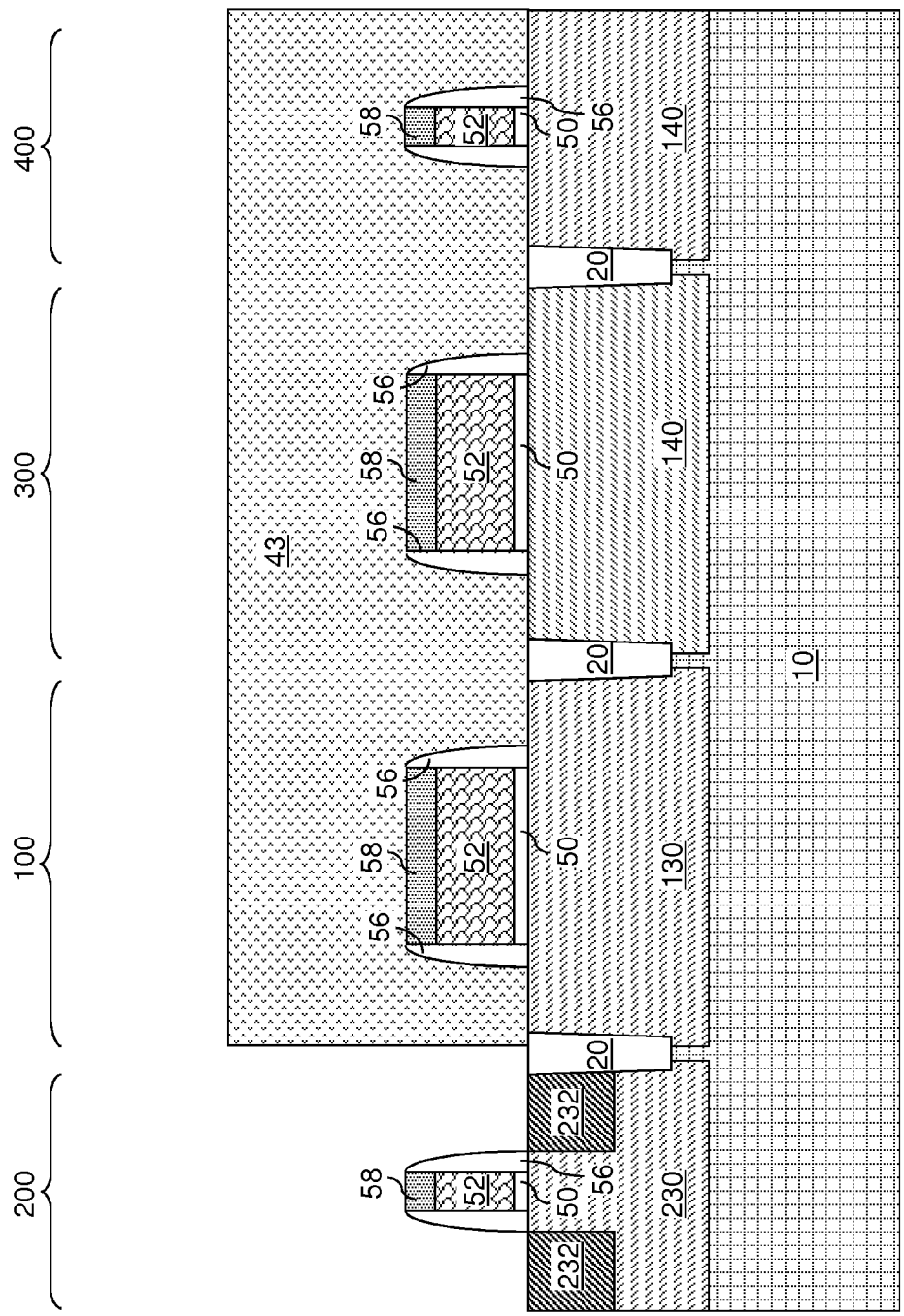
FIG. 2 is a vertical cross-sectional view of the exemplary semiconductor structure after formation of second conductivity type embedded active regions according to an embodiment of the present disclosure.

Referring to FIG. 2, a first photoresist layer 43 can be applied over the exemplary structure, and can be lithographically patterned to form an opening in the second device region 200, while the first, third, and fourth device regions (100, 300, 400) are masked by the first photoresist layer 43. Electrical dopants of the second conductivity type can be implanted to form first embedded active regions 232, which are a combination of a first embedded source region and a first embedded drain region. As used herein, an "embedded active region," an "embedded source region," and an "embedded drain region" refer to an active region, a source region, and a drain region, respectively, that are located within a semiconductor material portion, and directly underneath a top surface of the semiconductor material portion, and having a uniform thickness, preferably below the gate stacks in the substrate 10. The first embedded active regions 232 are second conductivity type embedded active regions, i.e., embedded active regions having a doping of the second conductivity type. The second doped semiconductor well 230 has a doping of the first conductivity type (which is the opposite of the second conductivity type) and includes a channel of the field effect transistor (which is herein referred to as a second field effect transistor) that is present in the second device region 200. The first photoresist layer 43 can be subsequently removed, for example, by ashing.

Figure 3:
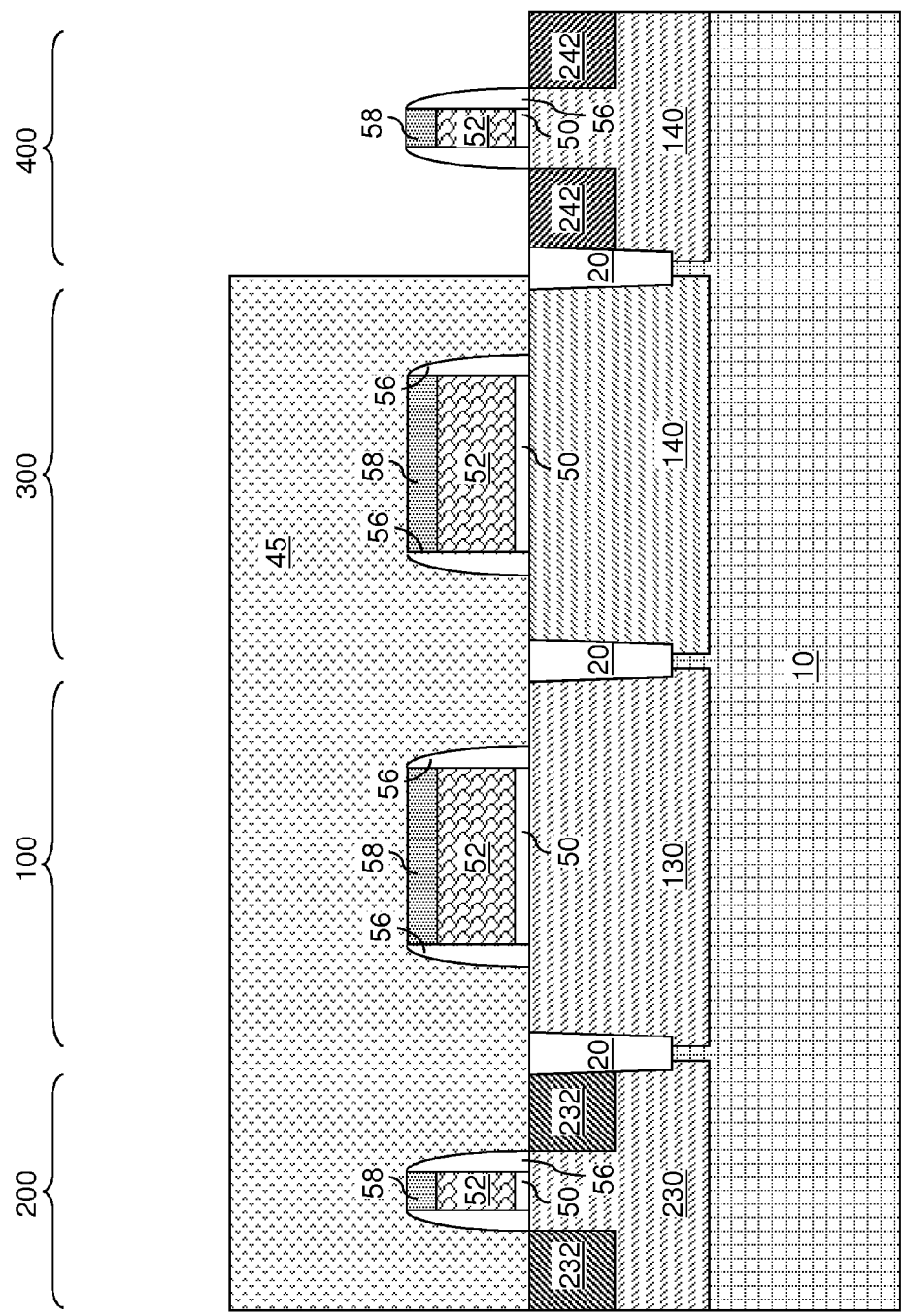
FIG. 3 is a vertical cross-sectional view of the exemplary semiconductor structure after formation of first conductivity type embedded active regions according to an embodiment of the present disclosure.

Referring to FIG. 3, a second photoresist layer 45 can be applied over the exemplary structure, and can be lithographically patterned to form an opening in the fourth device region 400, while the first, second, and third device regions (100, 200, 300) are masked by the second photoresist layer 45. Electrical dopants of the first conductivity type can be implanted to form second embedded active regions 242, which are a combination of a second embedded source region and a second embedded drain region. The second embedded active regions 242 are first conductivity type embedded active regions, i.e., embedded active regions having a doping of the first conductivity type. The fourth doped semiconductor well 240 has a doping of the second conductivity type and includes a channel of the field effect transistor (which is herein referred to as a fourth field effect transistor) that is present in the fourth device region 400. The second photoresist layer 45 can be subsequently removed, for example, by ashing.

An activation anneal that activates the implanted dopants in the optional lightly doped source/drain regions (not shown) and in the embedded active regions (232, 242) can be performed. The activation anneal can be a rapid thermal anneal or a furnace anneal at an elevated temperature, which can be in a range from 700° C. to 1,100° C., although lesser and greater temperatures can also be employed.

Figure 4:
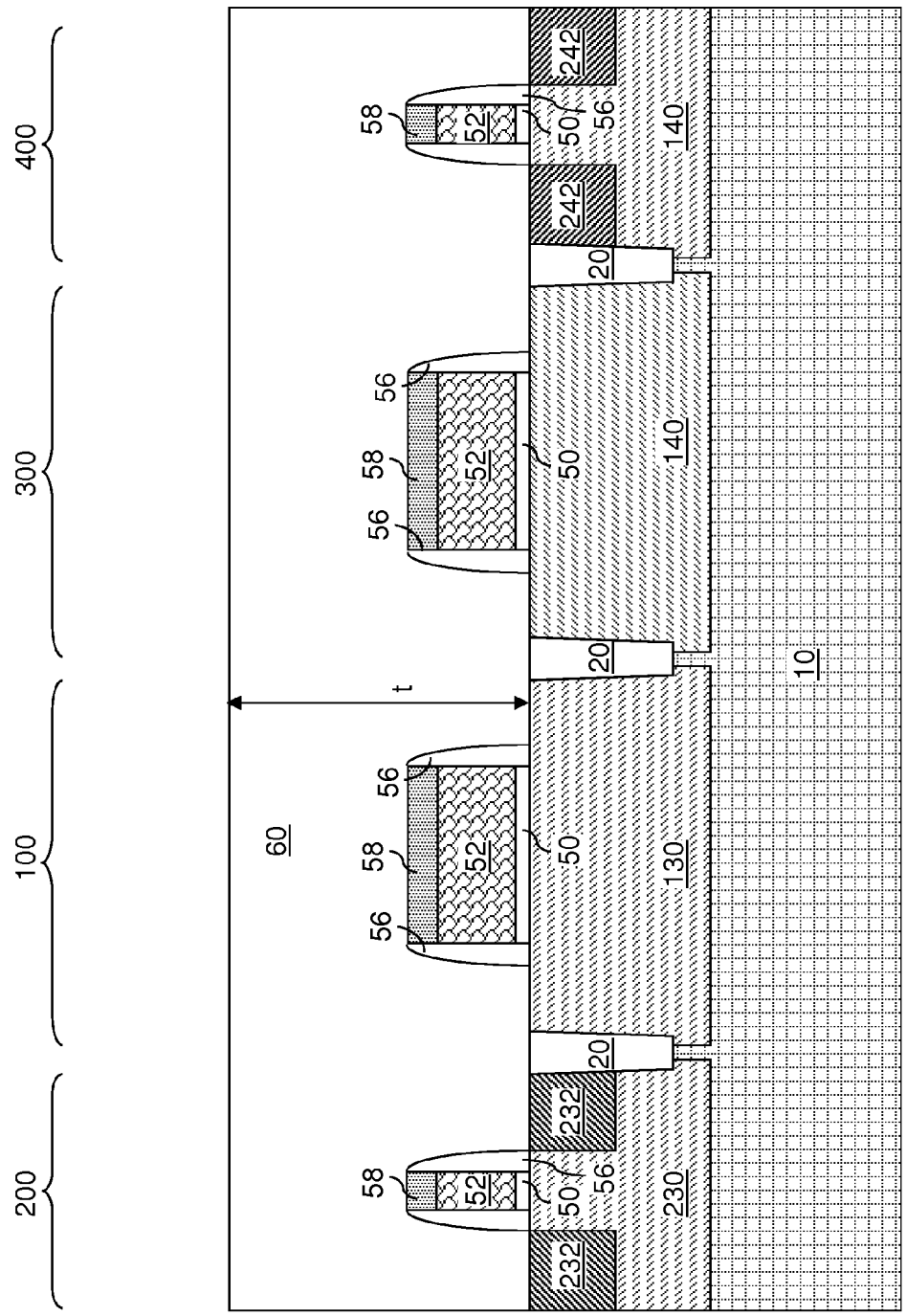
FIG. 4 is a vertical cross-sectional view of the exemplary semiconductor structure after formation of a contiguous dielectric material layer according to an embodiment of the present disclosure.

Referring to FIG. 4, a contiguous dielectric material layer 60 can be formed over the gate stacks (50, 52, 58) by deposition of at least one dielectric material. The at least one dielectric material can include one or more of silicon oxide, silicon nitride, silicon oxynitride, and organosilicate glass. The contiguous dielectric material layer 60 laterally surrounds each of the gate stacks (50, 52, 58). In one embodiment, the contiguous dielectric material layer 60 includes a silicon oxide layer. Optionally, the top surface of the contiguous dielectric material layer 60 can be planarized, for example, by chemical mechanical planarization (CMP). The thickness t of the contiguous dielectric material layer 60, as measured between the top surface of the contiguous dielectric material layer 60 and the bottommost surface of the dielectric material layer 60, is greater than the height of the gate stacks (50, 52, 58), and can be in a range from 100 nm to 1,000 nm, although lesser and greater thicknesses can also be employed.

Figure 5:
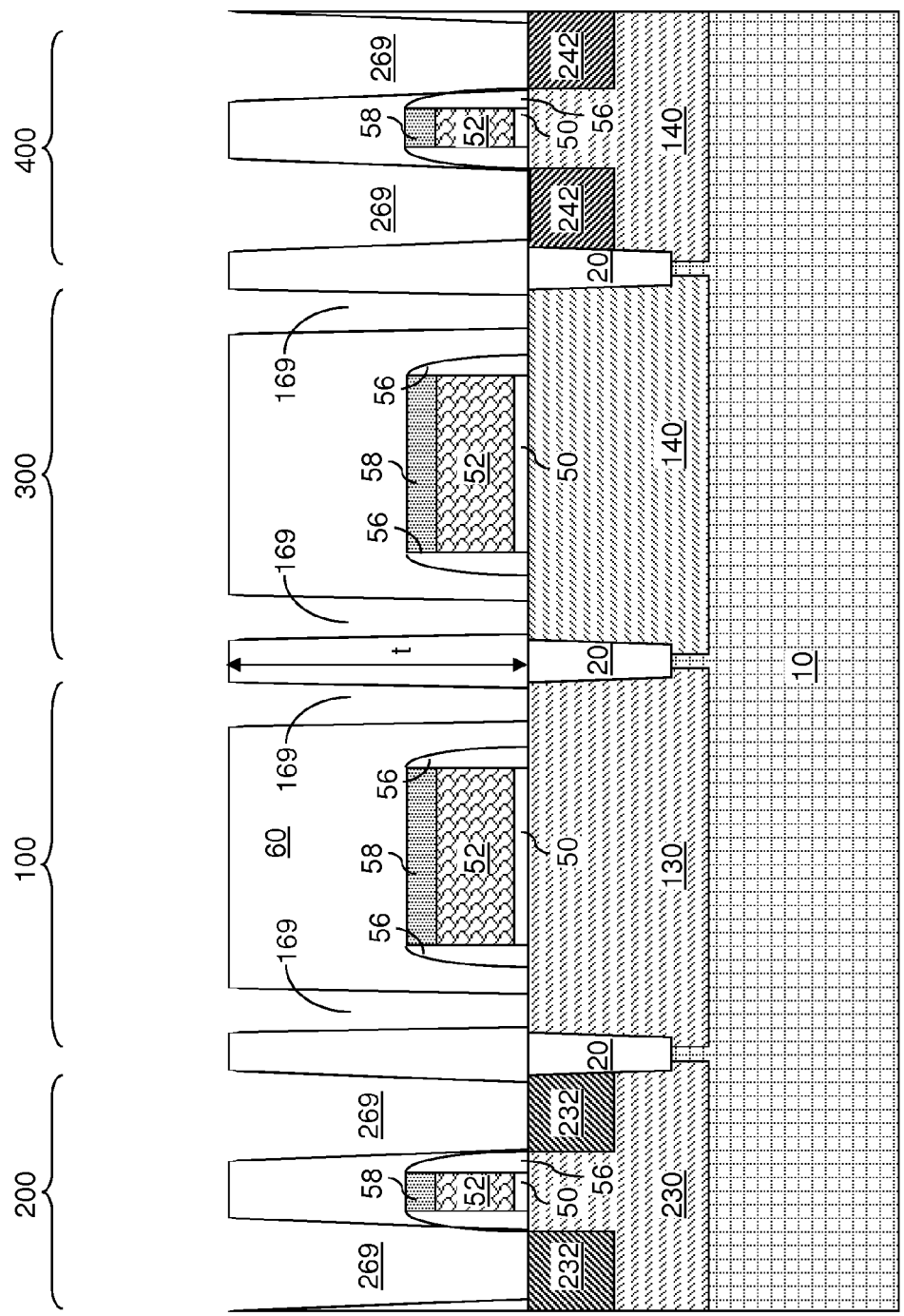
FIG. 5 is a vertical cross-sectional view of the exemplary semiconductor structure after formation of via cavities through the contiguous dielectric material layer according to an embodiment of the present disclosure.

Referring to FIG. 5, a photoresist layer (not shown) can be applied over the contiguous dielectric material layer 60, and can be lithographically patterned to form openings therein. The openings are formed in areas in which formation of via cavities through the contiguous dielectric material layer 60 is desired.

An anisotropic etch process is performed to transfer the pattern in the photoresist layer through the contiguous dielectric material layer 60. Via cavities (169, 269) are formed through the contiguous dielectric material layer 60 in volumes underlying the openings in the photoresist layer. Each via cavity (169, 269) can extend from the top surface of the contiguous dielectric material layer 60 to top surfaces of various semiconductor material portions within the semiconductor substrate. The various semiconductor material portions can include the first and second embedded active regions (232, 242), a first doped semiconductor well 130, and a third doped semiconductor well 140. The via cavities (169, 269) can include first via cavities 169 that extend to surfaces of the first doped semiconductor well 130 and the third doped semiconductor well 140, and second via cavities 269 that extend to surfaces of the first and second embedded active regions (232, 242).

In one embodiment, a pair of first via cavities 169 can be formed adjacent to each gate stack (50, 52, 58) and through the contiguous dielectric material layer 60 in the first and third device regions (100, 300). Each first via cavities 169 can extend from a top surface of the contiguous dielectric material layer 60 to a top surface of the semiconductor substrate.

In one embodiment, pairs of second via cavities 269 can extend from the top surface of the contiguous dielectric material layer 60 to top surfaces of the first and second embedded active regions (232, 242), i.e., the embedded source regions and the embedded drain regions. In one embodiment, each second via cavity 269 can be formed such that the area of the opening at the bottom of the second via cavity 269 is entirely within, and is less than, the top surface area of an underlying embedded active region (232, 242). In other words, the area of each opening at the bottom of each via cavity within the pairs of second via cavities 269 can be entirely within, and is less than, the top surface area of the underlying embedded active region (232, 242), which can be selected from the embedded source regions and the embedded drain regions.

In one embodiment, a portion of the top surface of the first doped semiconductor well 130 can be physically exposed at the bottom of each first via cavity 169 in the first device region 100, and a portion of the top surface of the third doped semiconductor well 140 can be physically exposed at the bottom of each first via cavity 169 in the third device region 300. In one embodiment, a portion of the top surface of a first embedded active region 232 can be physically exposed at the bottom of each second via cavity 269 in the second device region 200, and a portion of the top surface of a second embedded active region 242 can be physically exposed at the bottom of each second via cavity 269 in the fourth device region 400. Each via cavity (169, 269) can have a sidewall that is vertical or tapered.

In one embodiment, each of the first via cavities 169 can have a lesser bottom area than any of second via cavities 269, such as 10-75% of the area of the second via cavities. In one embodiment, the first via cavities 169 can have an average bottom area that is less than one half of the average bottom area of the second via cavities 269. In another embodiment, the first via cavities 169 can have an average bottom area that is less than one fourth of the average bottom area of the second via cavities 269.

In one embodiment, a periphery of each first via cavity 169 can be laterally spaced from the outer periphery of a nearest gate spacer 56. In another embodiment, a portion of an outer sidewall of a gate spacer 56 can be physically exposed inside a second cavity 269. In general, the lateral distance between a bottom periphery of a first via cavity 169 and a gate stack (50, 52, 58) that is nearest to the first via cavity 169 can be greater than the lateral distance between a bottom periphery of a second via cavity 269 and a gate stack (50, 52, 58) that is nearest to the second via cavity 269.

Figure 6:
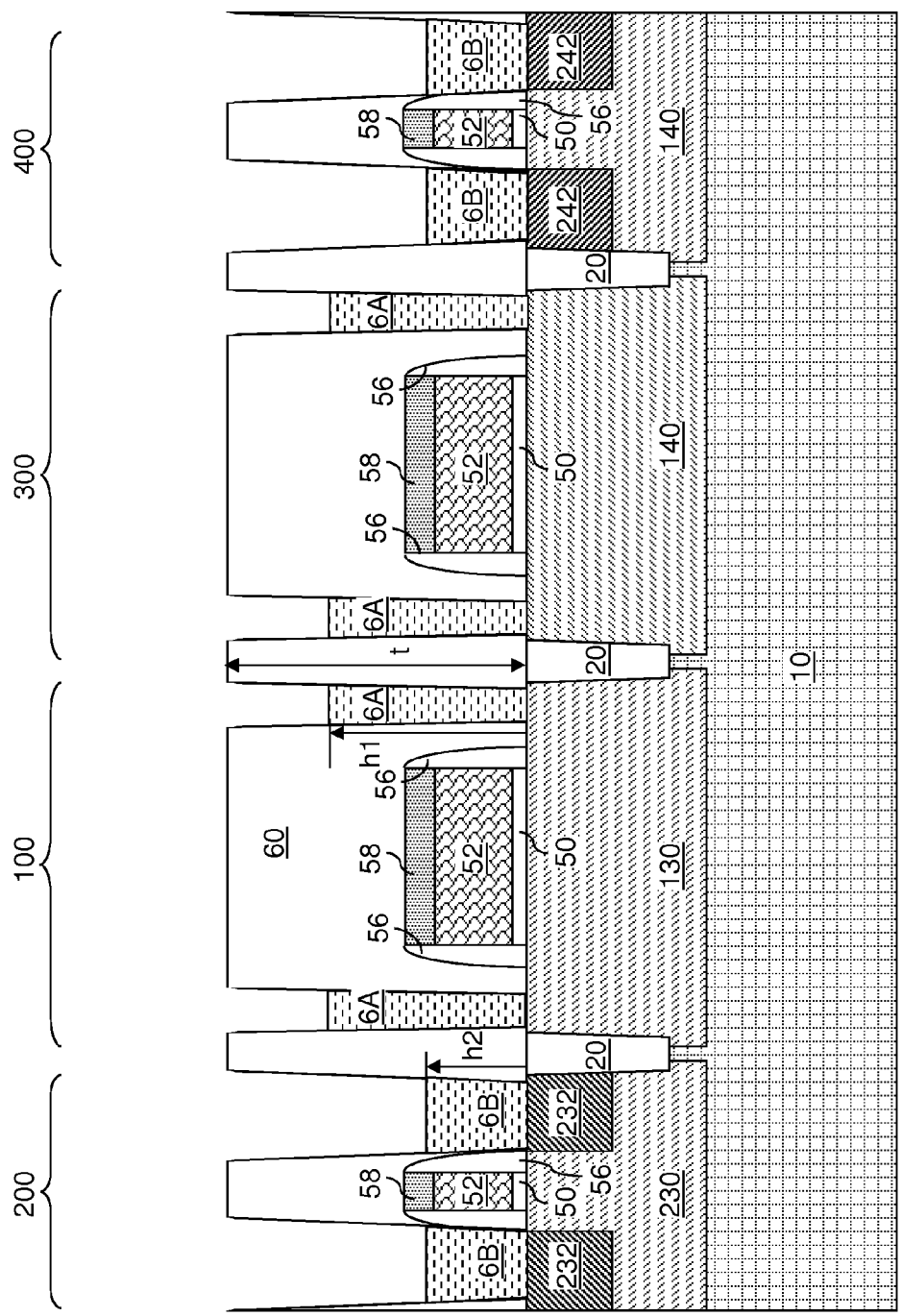
FIG. 6 is a vertical cross-sectional view of the exemplary semiconductor structure after formation of epitaxial pillar structures according to an embodiment of the present disclosure.

Referring to FIG. 6, epitaxial pillar structures (6A, 6B) can be formed by a selective epitaxy process that deposits a single crystalline semiconductor material directly on the physically exposed horizontal semiconductor surfaces of the various semiconductor material portions (130, 140, 232, 242). As used herein, an "epitaxial pillar structure" refers to a pillar structure that is single crystalline and is in contact with, and in epitaxial alignment with, another single crystalline structure. As used herein, a "pillar structure" refers to a structure having a constant horizontal cross-sectional shape defined by a constant periphery that is independent of height or a gradually varying cross-sectional shape that changes gradually with height. A pillar structure may have a planar bottom surface and a planar top surface, which is the case with some of the embodiments herein.

The epitaxial pillar structures (6A, 6B) can comprise a single crystalline elemental semiconductor material (such as Si or Ge), a single crystalline semiconductor alloy including at least one elemental semiconductor material (such as a silicon-germanium alloy, a silicon-carbon alloy, and a silicon-germanium-carbon alloy), a single crystalline compound semiconductor material (such as GaAs, InGaAs, and InGaAsP), or a combination thereof.

In a selective epitaxy process, a reactant and an etchant can be simultaneously or alternately flowed into a process chamber including the exemplary semiconductor structure to deposit a single crystalline semiconductor material on physically exposed single crystalline semiconductor surfaces, while deposition of the semiconductor material from dielectric surfaces that include amorphous dielectric materials is suppressed. The selective deposition can be induced by the difference between the nucleation rate of the semiconductor material on the semiconductor surfaces and the nucleation rate of the semiconductor material on the insulator surfaces (which is less than the nucleation rate of the semiconductor material on the semiconductor surfaces). By selecting the flow rate of the etchant to be between the nucleation rate of the semiconductor material on the semiconductor surfaces and the nucleation rate of the semiconductor material on the insulator surfaces, the selective epitaxy process can grow the semiconductor material only from the semiconductor surfaces, while suppressing deposition of the semiconductor material on the insulator surfaces.

In one embodiment, a pair of first epitaxial pillar structures 6A can be formed by the selective epitaxy process directly on, and in epitaxial alignment with, the first doped semiconductor well 130 within the semiconductor substrate in the first device region 100. Another pair of first epitaxial pillar structures 6A can be formed by the selective epitaxy process directly on, and in epitaxial alignment with, the third doped semiconductor well 140 within the semiconductor substrate in the third device region 300. A pair of second epitaxial pillar structures 6B can be formed by the selective epitaxy process directly on, and in epitaxial alignment with, the first embedded active region 232 within the semiconductor substrate in the second device region 200. Another pair of second epitaxial pillar structures 6B can be formed by the selective epitaxy process directly on, and in epitaxial alignment with, the second embedded active region 242 within the semiconductor substrate in the fourth device region 400.

In one embodiment, a pair of first epitaxial pillar structures 6A can be formed at lower portions of a pair of first via cavities 169 in the first device region 100, and another pair of first epitaxial pillar structures 6A can be formed at lower portions of another pair of first via cavities 169 in the third device region 300. A pair of second epitaxial pillar structures 6B can be formed at lower portions of a pair of second via cavities 269 in the second device region 200, and another pair of second epitaxial pillar structures 6B can be formed at lower portions of another pair of second via cavities 269 in the fourth device region 400.

Since the selective epitaxy process deposits the same semiconductor material in each via cavity (169, 269), the portions of the deposited single crystalline semiconductor material in the first via cavities 169 can have the same composition as the portions of the deposited single crystalline semiconductor material in the second via cavities 269. Thus, the first epitaxial pillar structures 6A can have the same composition as the second epitaxial pillar structures 6B.

The semiconductor material of the first and second epitaxial pillar structures (6A, 6B) can be an intrinsic semiconductor material, a p-doped semiconductor material, or an n-doped semiconductor material. In one embodiment, the selective epitaxy process may not provide any dopant gas into the process chamber to avoid any intention doping of the deposited semiconductor material. In this case, an "undoped semiconductor material" can be deposited as the semiconductor material of the first and second epitaxial pillar structures (6A, 6B). As used herein, an "undoped semiconductor material" refers to a semiconductor material that is deposited employing a deposition process that does not introduce any external dopant gas during the deposition process. An undoped semiconductor material may be intrinsic, or may have a p-type doping or an n-type doping that is introduced during residual dopants that are present in the process chamber from previously performed processes, or introduced into the deposited semiconductor material by "autodoping." As used herein, "autodoping" refers to doping of a deposited semiconductor material by dopants that evaporate from a portion of the substrate on which the semiconductor material is deposited. For example, the dopants that evaporate from the physically exposed surfaces of the first and second embedded active regions (232, 242) can induce autodoping. An undoped semiconductor material is intrinsic, or has a low dopant concentration (such as less than $1.0 \times 10^{16}/cm^3$). In one embodiment, the first and second epitaxial pillar structures (6A, 6B) can be an intrinsic semiconductor material or an undoped semiconductor material.

In one embodiment, the semiconductor material of the first and second epitaxial pillar structures (6A, 6B) can be formed with in-situ doping of electrical dopants. The electrical dopants can have a doping of the first conductivity type or the second conductivity type.

In one embodiment, the first and second epitaxial pillar structures (6A, 6B) can be formed with in-situ doping to incorporate dopants of the second conductivity type. The concentration of the dopants of the second conductivity type in the first and second epitaxial pillar structures (6A, 6B) can be in a range from $1.0 \times 10^{15}/cm^3$ to $1.0 \times 10^{20}/cm^3$, although lesser and greater dopant concentrations can also be employed. In one embodiment, the first and second epitaxial pillar structures (6A, 6B) may have a dopant concentration gradient along a vertical direction. In one embodiment, the dopant concentration within the first and second epitaxial pillar structures (6A, 6B), as formed by in-situ doping, can increase along the vertical direction, i.e., increase with the distance from the horizontal plane including the top surface of the substrate. In some embodiments, presence of a gradient in the dopant concentration can alleviate, or eliminate, the need to implant additional dopants in subsequent processing steps. In one embodiment, the average concentration of the dopants of the second conductivity type in the first and second epitaxial pillar structures (6A, 6B) can be in a range from $1.0 \times 10^{15}/cm^3$ to $1.0 \times 10^{18}/cm^3$. In one embodiment, the average concentration of the dopants of the second conductivity type in the first and second epitaxial pillar structures (6A, 6B) can be in a range from $1.0 \times 10^{18}/cm^3$ to $1.0 \times 10^{19}/cm^3$. In one embodiment, the average concentration of the dopants of the second conductivity type in the first and second epitaxial pillar structures (6A, 6B) can be in a range from $1.0 \times 10^{19}/cm^3$ to $5.0 \times 10^{19}/cm^3$.

In one embodiment, a patterned photoresist layer can be formed over the exemplary semiconductor structure, and can be lithographically patterned to form openings in the third and fourth device regions (300, 400) while covering the first and second device regions (100, 200). Dopants of the first conductivity type can be implanted into upper portions or the entirety of the first and second epitaxial pillar structures (6A, 6B) within the third and fourth device regions (300, 400) to change the conductivity type of the doping of the implanted portions of first and second epitaxial pillar structures (6A, 6B) within the third and fourth device regions (300, 400) to the first conductivity type. The net concentration of the first conductivity type dopants (i.e., the difference between the total concentration of the first conductivity type dopants and the total concentration of the second conductivity type dopants) in the implanted portions of the first and second epitaxial pillar structures (6A, 6B) within the third and fourth device regions (300, 400) can be in a range from $1.0 \times 10^{15}/cm^3$ to $1.0 \times 10^{20}/cm^3$. The energy of the implanted dopant ions can be selected such that the first and second epitaxial pillar structures (6A, 6B) may have a dopant concentration gradient along a vertical direction. In one embodiment, the dopant concentration within the subset of the first and second epitaxial pillar structures (6A, 6B) that are implanted with electrical dopants can increase along the vertical direction, i.e., increase with the distance from the horizontal plane including the top surface of the substrate. In some embodiments, presence of a gradient in the dopant concentration can alleviate, or eliminate, the need to implant additional dopants in subsequent processing steps. In one embodiment, the average concentration of the dopants of the first conductivity type in the implanted first and second epitaxial pillar structures (6A, 6B) can be in a range from $1.0 \times 10^{15}/cm^3$ to $1.0 \times 10^{18}/cm^3$. In one embodiment, the average concentration of the dopants of the first conductivity type in the implanted first and second epitaxial pillar structures (6A, 6B) can be in a range from $1.0 \times 10^{18}/cm^3$ to $1.0 \times 10^{19}/cm^3$. In one embodiment, the average concentration of the dopants of the first conductivity type in the implanted first and second epitaxial pillar structures (6A, 6B) can be in a range from $1.0 \times 10^{19}/cm^3$ to $5.0 \times 10^{19}/cm^3$.

In one embodiment, the entirety of the first epitaxial pillar structures 6A in the third device region 300 can have a doping of the first conductivity type. In another embodiment, the upper portion of each first epitaxial pillar structure 6A in the third device region 300 can have a doping of the first conductivity type, and a lower portion of each first epitaxial pillar structure 6A in the third device region 300 can have a doping of the second conductivity type, such that the lower portion acts as part of the channel of the transistors, as will be described in more detail below with respect to FIG. 12.

Alternately, the first and second epitaxial pillar structures (6A, 6B) can be formed with in-situ doping to incorporate dopants of the first conductivity type. The concentration of the dopants of the first conductivity type in the first and second epitaxial pillar structures (6A, 6B) can be in a range from $1.0 \times 10^{15}/cm^3$ to $1.0 \times 10^{20}/cm^3$, although lesser and greater dopant concentrations can also be employed. In one embodiment, the first and second epitaxial pillar structures (6A, 6B) may have a dopant concentration gradient along a vertical direction. In one embodiment, the dopant concentration within the first and second epitaxial pillar structures (6A, 6B), as formed by in-situ doping, can increase along the vertical direction, i.e., increase with the distance from the horizontal plane including the top surface of the substrate. In some embodiments, presence of a gradient in the dopant concentration can alleviate, or eliminate, the need to implant additional dopants in subsequent processing steps. In one embodiment, the average concentration of the dopants of the first conductivity type in the first and second epitaxial pillar structures (6A, 6B) can be in a range from $1.0 \times 10^{15}/cm^3$ to $1.0 \times 10^{18}/cm^3$. In one embodiment, the average concentration of the dopants of the first conductivity type in the first and second epitaxial pillar structures (6A, 6B) can be in a range from $1.0 \times 10^{18}/cm^3$ to $1.0 \times 10^{19}/cm^3$. In one embodiment, the average concentration of the dopants of the first conductivity type in the first and second epitaxial pillar structures (6A, 6B) can be in a range from $1.0 \times 10^{19}/cm^3$ to $5.0 \times 10^{19}/cm^3$.

In one embodiment, a patterned photoresist layer can be formed over the exemplary semiconductor structure, and can be lithographically patterned to form openings in the first and second device regions (100, 200) while covering the third and fourth device regions (300, 400). Dopants of the second conductivity type can be implanted into the first and second epitaxial pillar structures (6A, 6B) within the first and second device regions (100, 200) to change the conductivity type of the doping of the first and second epitaxial pillar structures (6A, 6B) within the first and second device regions (100, 200) to the second conductivity type. The net concentration of the second conductivity type dopants (i.e., the difference between the total concentration of the second conductivity type dopants and the total concentration of the first conductivity type dopants) in the first and second epitaxial pillar structures (6A, 6B) within the first and second device regions (100, 200) can be in a range from $1.0 \times 10^{15}/cm^3$ to $1.0 \times 10^{20}/cm^3$. The energy of the implanted dopant ions can be selected such that the first and second epitaxial pillar structures (6A, 6B) may have a dopant concentration gradient along a vertical direction. In one embodiment, the dopant concentration within the subset of the first and second epitaxial pillar structures (6A, 6B) that are implanted with electrical dopants can increase along the vertical direction, i.e., increase with the distance from the horizontal plane including the top surface of the substrate. In some embodiments, presence of a gradient in the dopant concentration can alleviate, or eliminate, the need to implant additional dopants in subsequent processing steps. In one embodiment, the average concentration of the dopants of the second conductivity type in the implanted first and second epitaxial pillar structures (6A, 6B) can be in a range from $1.0 \times 10^{15}/cm^3$ to $1.0 \times 10^{18}/cm^3$. In one embodiment, the average concentration of the dopants of the second conductivity type in the implanted first and second epitaxial pillar structures (6A, 6B) can be in a range from $1.0 \times 10^{18}/cm^3$ to $1.0 \times 10^{19}/cm^3$. In one embodiment, the average concentration of the dopants of the second conductivity type in the implanted first and second epitaxial pillar structures (6A, 6B) can be in a range from $1.0 \times 10^{19}/cm^3$ to $5.0 \times 10^{19}/cm^3$.

In one embodiment, the entirety of the first epitaxial pillar structures 6A in the first device region 100 can have a doping of the second conductivity type. In another embodiment, the upper portion of each first epitaxial pillar structure 6A in the first device region 100 can have a doping of the second conductivity type, and a lower portion of each first epitaxial pillar structure 6A in the first device region 100 can have a doping of the first conductivity type, such that the lower portions acts as part of the channel of the transistor.

Yet alternately, a first sacrificial thin dielectric layer (such as a silicon nitride layer having a thickness of about 3 nm; not shown) can be deposited and patterned to cover the third and fourth device regions (300, 400). A first subset of the first and second epitaxial pillar structures (6A, 6B) can be formed with in-situ doping to incorporate dopants of the second conductivity type in the first and second device regions (100, 200), while the semiconductor material is not deposited in the third and fourth device regions (300, 400). The concentration of the dopants of the second conductivity type in the first and second epitaxial pillar structures (6A, 6B) in the first and second device regions (100, 200) can be in a range from $1.0 \times 10^{15}/cm^3$ to $1.0 \times 10^{20}/cm^3$, although lesser and greater dopant concentrations can also be employed. In one embodiment, the first and second epitaxial pillar structures (6A, 6B) may have a dopant concentration gradient along a vertical direction. In one embodiment, the dopant concentration within the first and second epitaxial pillar structures (6A, 6B), as formed by in-situ doping, can increase along the vertical direction, i.e., increase with the distance from the horizontal plane including the top surface of the substrate. In some embodiments, presence of a gradient in the dopant concentration can alleviate, or eliminate, the need to implant additional dopants in subsequent processing steps. In one embodiment, the average concentration of the dopants of the second conductivity type in the first and second epitaxial pillar structures (6A, 6B) can be in a range from $1.0 \times 10^{15}/cm^3$ to $1.0 \times 10^{18}/cm^3$. In one embodiment, the average concentration of the dopants of the second conductivity type in the first and second epitaxial pillar structures (6A, 6B) can be in a range from $1.0 \times 10^{18}/cm^3$ to $1.0 \times 10^{19}/cm^3$. In one embodiment, the average concentration of the dopants of the second conductivity type in the first and second epitaxial pillar structures (6A, 6B) can be in a range from $1.0 \times 10^{19}/cm^3$ to $5.0 \times 10^{19}/cm^3$.

The first sacrificial thin dielectric layer can be removed, for example, by a wet etch. A second sacrificial thin dielectric layer (such as a silicon nitride layer having a thickness of about 3 nm; not shown) can be deposited and patterned to cover the first and second device regions (100, 200).

A second subset of the first and second epitaxial pillar structures (6A, 6B) can be formed with in-situ doping to incorporate dopants of the first conductivity type in the third and fourth device regions (300, 400), while the semiconductor material is not deposited in the first and second device regions (100, 200). The concentration of the dopants of the first conductivity type in the first and second epitaxial pillar structures (6A, 6B) in the third and fourth device regions (300, 400) can be in a range from $1.0 \times 10^{15}/cm^3$ to $1.0 \times 10^{20}/cm^3$, although lesser and greater dopant concentrations can also be employed. In one embodiment, the first and second epitaxial pillar structures (6A, 6B) may have a dopant concentration gradient along a vertical direction. In one embodiment, the dopant concentration within the first and second epitaxial pillar structures (6A, 6B), as formed by in-situ doping, can increase along the vertical direction, i.e., increase with the distance from the horizontal plane including the top surface of the substrate. In some embodiments, presence of a gradient in the dopant concentration can alleviate, or eliminate, the need to implant additional dopants in subsequent processing steps. In one embodiment, the average concentration of the dopants of the first conductivity type in the first and second epitaxial pillar structures (6A, 6B) can be in a range from $1.0 \times 10^{15}/cm^3$ to $1.0 \times 10^{18}/cm^3$. In one embodiment, the average concentration of the dopants of the first conductivity type in the first and second epitaxial pillar structures (6A, 6B) can be in a range from $1.0 \times 10^{18}/cm^3$ to $1.0 \times 10^{19}/cm^3$. In one embodiment, the average concentration of the dopants of the first conductivity type in the first and second epitaxial pillar structures (6A, 6B) can be in a range from $1.0 \times 10^{19}/cm^3$ to $5.0 \times 10^{19}/cm^3$. The second sacrificial thin dielectric layer can be removed, for example, by a wet etch.

Still alternately, a first sacrificial thin dielectric layer (such as a silicon nitride layer having a thickness of about 3 nm; not shown) can be deposited and patterned to cover the first and second device regions (100, 200). A first subset of the first and second epitaxial pillar structures (6A, 6B) can be formed with in-situ doping to incorporate dopants of the first conductivity type in the third and fourth device regions (300, 400), while the semiconductor material is not deposited in the first and second device regions (100, 200). The concentration of the dopants of the first conductivity type in the first and second epitaxial pillar structures (6A, 6B) in the third and fourth device regions (300, 400) can be in a range from $1.0 \times 10^{15}/cm^3$ to $1.0 \times 10^{20}/cm^3$, although lesser and greater dopant concentrations can also be employed. In one embodiment, the first and second epitaxial pillar structures (6A, 6B) may have a dopant concentration gradient along a vertical direction. In one embodiment, the dopant concentration within the first and second epitaxial pillar structures (6A, 6B), as formed by in-situ doping, can increase along the vertical direction, i.e., increase with the distance from the horizontal plane including the top surface of the substrate. In some embodiments, presence of a gradient in the dopant concentration can alleviate, or eliminate, the need to implant additional dopants in subsequent processing steps. In one embodiment, the average concentration of the dopants of the first conductivity type in the first and second epitaxial pillar structures (6A, 6B) can be in a range from $1.0 \times 10^{15}/cm^3$ to $1.0 \times 10^{18}/cm^3$. In one embodiment, the average concentration of the dopants of the first conductivity type in the first and second epitaxial pillar structures (6A, 6B) can be in a range from $1.0 \times 10^{18}/cm^3$ to $1.0 \times 10^{19}/cm^3$. In one embodiment, the average concentration of the dopants of the first conductivity type in the first and second epitaxial pillar structures (6A, 6B) can be in a range from $1.0 \times 10^{19}/cm^3$ to $5.0 \times 10^{19}/cm^3$.

The first sacrificial thin dielectric layer can be removed, for example, by a wet etch. A second sacrificial thin dielectric layer (such as a silicon nitride layer having a thickness of about 3 nm; not shown) can be deposited and patterned to cover the third and fourth device regions (300, 400). A second subset of the first and second epitaxial pillar structures (6A, 6B) can be formed with in-situ doping to incorporate dopants of the second conductivity type in the first and second device regions (100, 200), while the semiconductor material is not deposited in the third and fourth device regions (300, 400). The concentration of the dopants of the second conductivity type in the first and second epitaxial pillar structures (6A, 6B) in the first and second device regions (100, 200) can be in a range from $1.0 \times 10^{15}/cm^3$ to $1.0 \times 10^{20}/cm^3$, although lesser and greater dopant concentrations can also be employed. In one embodiment, the first and second epitaxial pillar structures (6A, 6B) may have a dopant concentration gradient along a vertical direction. In one embodiment, the dopant concentration within the first and second epitaxial pillar structures (6A, 6B), as formed by in-situ doping, can increase along the vertical direction, i.e., increase with the distance from the horizontal plane including the top surface of the substrate. In some embodiments, presence of a gradient in the dopant concentration can alleviate, or eliminate, the need to implant additional dopants in subsequent processing steps. In one embodiment, the average concentration of the dopants of the second conductivity type in the first and second epitaxial pillar structures (6A, 6B) can be in a range from $1.0 \times 10^{15}/cm^3$ to $1.0 \times 10^{18}/cm^3$. In one embodiment, the average concentration of the dopants of the second conductivity type in the first and second epitaxial pillar structures (6A, 6B) can be in a range from $1.0 \times 10^{18}/cm^3$ to $1.0 \times 10^{19}/cm^3$. In one embodiment, the average concentration of the dopants of the second conductivity type in the first and second epitaxial pillar structures (6A, 6B) can be in a range from $1.0 \times 10^{19}/cm^3$ to $5.0 \times 10^{19}/cm^3$. The second sacrificial thin dielectric layer can be removed, for example, by a wet etch.

In one embodiment, the volume of each first via cavity 169 can be less than the volume of any second via cavity 269. For example, the volume of each first via cavity 169 can be less than the volume of the smallest second via cavity 269 by a factor of two, by a factor of four, or by a factor of eight or more.

In one embodiment, the selective epitaxy process can be depletive, i.e., the consumption of the reactant is severe enough that the amount of the deposited semiconductor material depends on the transport of the semiconductor reactant gas from the gas stream toward the bottom of the via cavities (169, 269) (which may occur through a laminar flow region). In other words, the amount of the deposited semiconductor material is limited by the transport of the semiconductor reactant precursor through the gas steam during the selective deposition process. In this case, less semiconductor material is deposited per area on a surface within a region of a high areal density of physically exposed semiconductor areas than on a surface within a region of a low areal density of physically exposed semiconductor areas.

Since the first via cavities 169 has a lesser bottom area than the second via cavities 269, the physically exposed surfaces of the first and third doped semiconductor wells (130, 14) are within a region of a lesser areal density of physically exposed semiconductor areas, and the physically exposed surfaces of the first and second embedded active regions (232, 242) are within a region of a greater areal density of physically exposed semiconductor areas. Correspondingly, portions of the deposited single crystalline semiconductor material in the first via cavities 169 has a greater thickness than portions of the deposited single crystalline semiconductor material in the pair of second via cavities 269. In other words, the first epitaxial pillar structures 6A can have a greater height than the second epitaxial pillar structures 6B. The height of the first epitaxial pillar structures 6A formed in the first via cavities 169 is herein referred to as a first height h1. The height of the second epitaxial pillar structures 6B formed in the second via cavities 269 is herein referred to as a second height h2 that is less than the first height h1.

In one embodiment, the second height h2 of the second epitaxial pillar structures 6B can be in a range from 10% to 90% of the first height h1 of the first epitaxial pillar structures 6A. In another embodiment, the second height h2 of the second epitaxial pillar structures 6B can be in a range from 20% to 80% of the first height h1 of the first epitaxial pillar structures 6A. In yet another embodiment, the second height h2 of the second epitaxial pillar structures 6B can be in a range from 30% to 70% of the first height h1 of the first epitaxial pillar structures 6A. In still another embodiment, the second height h2 of the second epitaxial pillar structures 6B can be in a range from 40% to 60% of the first height h1 of the first epitaxial pillar structures 6A.

In one embodiment, the first height h1 of the first epitaxial pillar structures 6A can be in a range from 10% to 100% of the thickness t of the contiguous dielectric material layer. In another embodiment, the first height h1 of the first epitaxial pillar structures 6A can be in a range from 20% to 80% of the thickness t of the contiguous dielectric material layer. In yet another embodiment, the first height h1 of the first epitaxial pillar structures 6A can be in a range from 30% to 70% of the thickness t of the contiguous dielectric material layer. In still another embodiment, the first height h1 of the first epitaxial pillar structures 6A can be in a range from 40% to 60% of the thickness t of the contiguous dielectric material layer.

Figure 7:
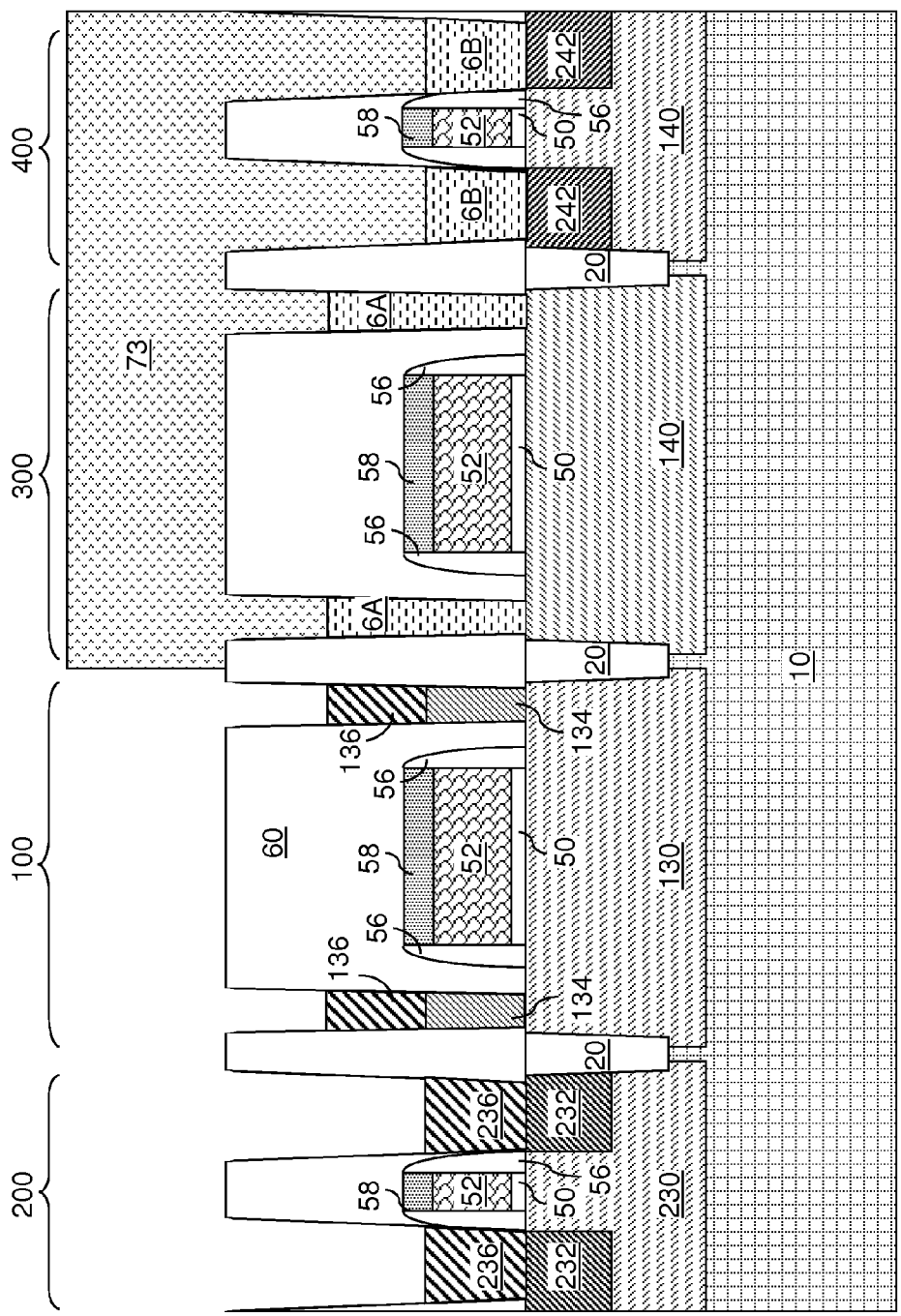
FIG. 7 is a vertical cross-sectional view of the exemplary semiconductor structure after masked implantation of electrical dopants of the second conductivity type according to an embodiment of the present disclosure.

Referring to FIG. 7, a first mask layer 73 is formed over the exemplary semiconductor structure such that the first mask layer 73 covers the third and fourth device regions (300, 400), while not covering the first and second device regions (100, 200). In one embodiment, the first mask layer 73 can be a patterned photoresist layer.

Electrical dopants of the second conductivity type can be implanted into upper portions of the first epitaxial pillar structures 6A in the first device region 100 to form first active regions 136, which include a first source region and a first drain region. The first source region is an elevated source region, i.e., a source region of which a bottom surface is vertically spaced from, and located above, a top surface of a semiconductor substrate. The first drain region is an elevated drain region, i.e., a drain region of which a bottom surface is vertically spaced from, and located above, a top surface of a semiconductor substrate. The first active regions 136 are elevated active regions, i.e., active regions of which bottom surfaces are vertically spaced from, and located above, a top surface of a semiconductor substrate.

The concentration of the dopants of the second conductivity type in the first active regions 136 in the first device region 100 can be in a range from $1.0 \times 10^{19}/cm^3$ to $2.0 \times 10^{21}/cm^3$, although lesser and greater dopant concentrations can also be employed. Each first active region 136 has a bottom surface located above, and vertically spaced from, the top surface of the semiconductor substrate, which may be coplanar with the horizontal interfaces between gate dielectrics 50 and the semiconductor substrate. The remaining portion of the first epitaxial pillar structures 6A in the first device region 100 can constitute first doped extension regions 134, which include a first source-extension region and a first drain-extension region.

The first doped semiconductor well 130 can have a doping of the first conductivity type. In one embodiment, the first epitaxial pillar structures 6A in the first device region 100 can be formed with in-situ doping to incorporate dopants of the second conductivity type therein. Alternatively, the first epitaxial pillar structures 6A in the first device region 100 can be formed as intrinsic semiconductor material portions, and electrical dopants of the second conductivity type can be implanted into lower portions of the first epitaxial pillar structures 6A at a low concentration (e.g., in a range from $1.0 \times 10^{15}/cm^3$ to $1.0 \times 10^{19}/cm^3$) to form the first doped extension regions 134, and then additional dopants of the second conductivity type can be implanted into upper portions of the first epitaxial pillar structures 6A to form the first active regions 136, which have a doping of the second conductivity type at a higher concentration (e.g., in a range from $1.0 \times 10^{19}/cm^3$ to $2.0 \times 10^{21}/cm^3$). Yet alternatively, the first epitaxial pillar structures in the first device region 100 can be formed as intrinsic semiconductor material portions, electrical dopants of the second conductivity type can be implanted into upper portions of the first epitaxial pillar structures 6A to form the first active regions 136, which have a doping of the second conductivity type at a high concentration (e.g., in a range from $1.0 \times 10^{19}/cm^3$ to $2.0 \times 10^{21}/cm^3$), and then electrical dopants of the second conductivity type can be implanted into lower portions of the first epitaxial pillar structures 6A at a low concentration (e.g., in a range from $1.0 \times 10^{15}/cm^3$ to $1.0 \times 10^{19}/cm^3$) to form the first doped extension regions 134. In this case, a first source-extension region can be formed underneath the first source region, and a first drain-extension region can be formed underneath the first drain region.

The first source-extension region and the first drain-extension region (also knows a halo or low doped drain (LDD) region) can have a doping of the same conductivity type (i.e., the second conductivity type) as the first source region and the first drain region. The dopant concentration of the first source-extension region and the first drain-extension region is lower than the dopant concentration of the first source region and the first drain region.

Concurrent with formation of the first active regions 136 by implantation of dopants of the second conductivity type, dopants of the second conductivity type can be implanted into the second epitaxial pillar structures 6B to convert the second epitaxial pillar structures 6B into first raised active regions 236, which can include a first raised source region and a first raised drain region. In one embodiment, the first active regions 136 (including the first source region and the first drain region) in the first device region 100 and the first raised active regions 236 (including the first raised source region and the first raised drain region) in the second device region 200 can be simultaneously formed by performing the processing steps of FIG. 6 (i.e., the selective epitaxy process that deposits a single crystalline semiconductor material in the via cavities (169, 269)), and by implanting electrical dopants of the second conductivity type into portions of the deposited single crystalline semiconductor material.

In one embodiment, a fraction of the electrical dopants of the second conductivity type can be implanted in portions of the first embedded active regions 232 (which include the first embedded source region and the first embedded drain region) during formation of the first active regions 136 and the first raised active regions 236. In one embodiment, the depth of the ion implantation employed to form the first active regions 136 and the first raised active regions 236 can be selected such that the dopants of the second conductivity typed are not implanted to lower portions of deposited single crystalline semiconductor material in the first via cavities 169 (i.e., not into the volumes of the first doped extension regions 134). The first mask layer 73 can be subsequently removed, for example, by ashing.

Figure 8:
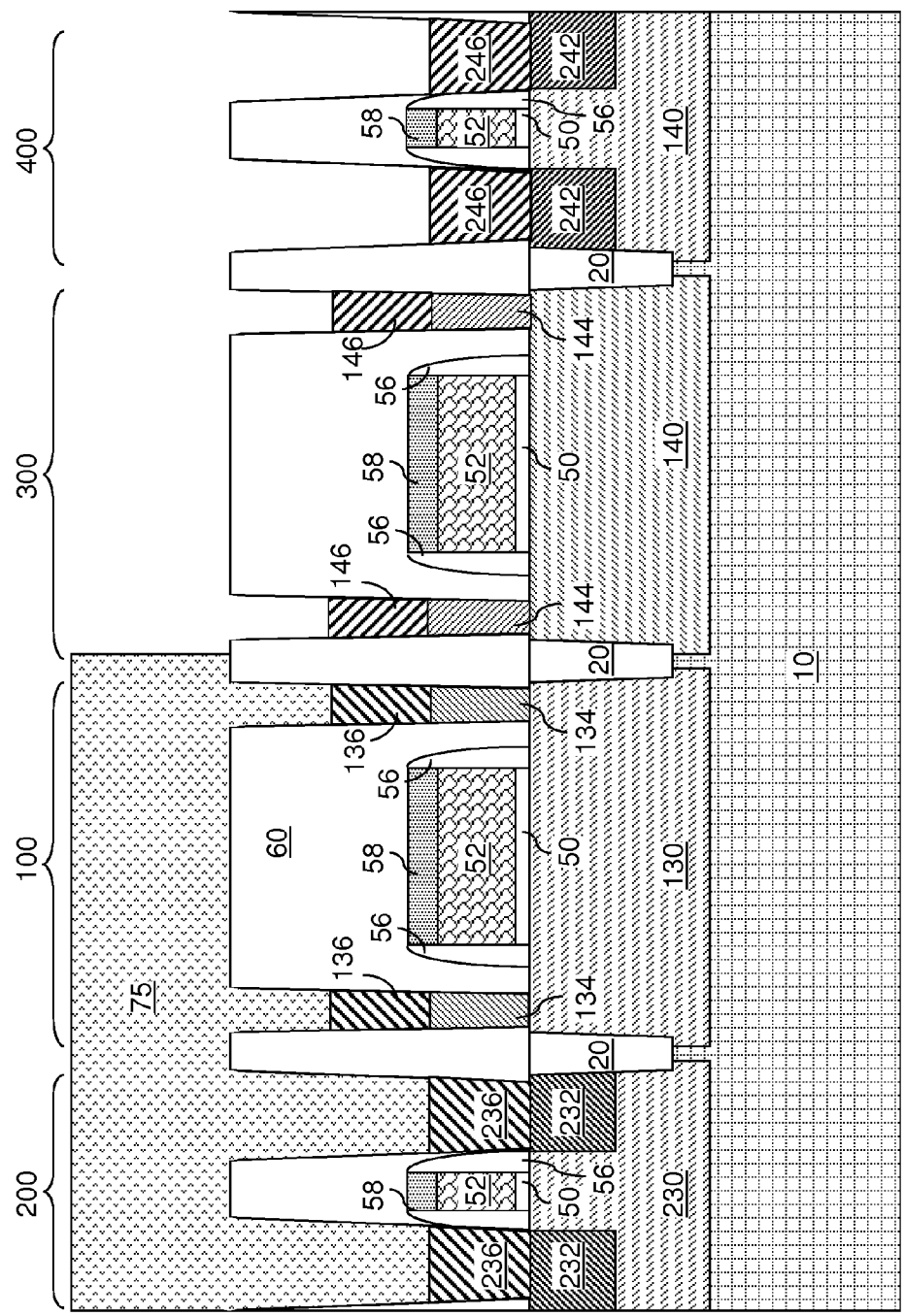
FIG. 8 is a vertical cross-sectional view of the exemplary semiconductor structure after masked implantation of electrical dopants of the first conductivity type according to an embodiment of the present disclosure.

Referring to FIG. 8, a second mask layer 75 is formed over the exemplary semiconductor structure such that the second mask layer 75 covers the first and second device regions (100, 200), while not covering the third and fourth device regions (300, 400). In one embodiment, the second mask layer 75 can be a patterned photoresist layer.

Electrical dopants of the first conductivity type can be implanted into upper portions of the first epitaxial pillar structures 6A in the third device region 300 to form second active regions 146, which include a second source region and a second drain region. The second source region is an elevated source region. The second drain region is an elevated drain region. The second active regions 146 are elevated active regions.

The concentration of the dopants of the first conductivity type in the second active regions 146 in the third device region 300 can be in a range from $1.0 \times 10^{19}/cm^3$ to $2.0 \times 10^{21}/cm^3$, although lesser and greater dopant concentrations can also be employed. Each second active region 146 has a bottom surface located above, and vertically spaced from, the top surface of the semiconductor substrate, which may be coplanar with the horizontal interfaces between gate dielectrics 50 and the semiconductor substrate. The remaining portion of the first epitaxial pillar structures 6A in the third device region 300 can constitute second doped extension regions 144, which include a second source-extension region and a second drain-extension region.

The second doped semiconductor well 140 can have a doping of the first conductivity type. In one embodiment, the first epitaxial pillar structures 6A in the third device region 300 cam be formed with in-situ doping to incorporate dopants of the first conductivity type therein. Alternatively, the first epitaxial pillar structures 6A in the third device region 300 can be formed as intrinsic semiconductor material portions, and electrical dopants of the first conductivity type can be implanted into lower portions of the first epitaxial pillar structures 6A at a lower concentration (e.g., in a range from $1.0 \times 10^{15}/cm^3$ to $1.0 \times 10^{19}/cm^3$) to form the second doped extension regions 144, and then additional dopants of the first conductivity type can be implanted into upper portions of the first epitaxial pillar structures 6A to form the second active regions 146, which have a doping of the first conductivity type at a high concentration (e.g., in a range from $1.0 \times 10^{19}/cm^3$ to $2.0 \times 10^{21}/cm^3$). Yet alternatively, the first epitaxial pillar structures 6A in the third device region 300 can be formed as intrinsic semiconductor material portions, electrical dopants of the first conductivity type can be implanted into upper portions of the first epitaxial pillar structures 6A to form the second active regions 146, which have a doping of the first conductivity type at a high concentration (e.g., in a range from $1.0 \times 10^{19}/cm^3$ to $2.0 \times 10^{21}/cm^3$), and then electrical dopants of the first conductivity type can be implanted into lower portions of the first epitaxial pillar structures 6A at a low concentration (e.g., in a range from $1.0 \times 10^{15}/cm^3$ to $1.0 \times 10^{19}/cm^3$) to form the second doped extension regions 144. In this case, a second source-extension region can be formed underneath the second source region, and a second drain-extension region can be formed underneath the second drain region.

The second source-extension region and the second drain-extension region (also known as halo or LDD region) can have a doping of the same conductivity type (i.e., the first conductivity type) as the second source region and the second drain region. The dopant concentration of the second source-extension region and the second drain-extension region is lower than the dopant concentration of the second source region and the second drain region.

Concurrent with formation of the second active regions 146 by implantation of dopants of the first conductivity type, dopants of the first conductivity type can be implanted into the second epitaxial pillar structures 6B to convert the second epitaxial pillar structures 6B into second raised active regions 246, which can include a second raised source region and a second raised drain region. In one embodiment, the second active regions 146 (including the second source region and the second drain region) in the third device region 300 and the second raised active regions 246 (including the second raised source region and the second raised drain region) in the fourth device region 400 can be simultaneously formed by performing the processing steps of FIG. 6 (i.e., the selective epitaxy process that deposits a single crystalline semiconductor material in the via cavities (169, 269)), and by implanting electrical dopants of the first conductivity type into portions of the deposited single crystalline semiconductor material.

In one embodiment, a fraction of the electrical dopants of the first conductivity type can be implanted portions of the second embedded active regions 234 (which include the second embedded source region and the second embedded drain region) during formation of the second active regions 146 and the second raised active regions 246. In one embodiment, the depth of the ion implantation employed to form the second active regions 146 and the second raised active regions 246 can be selected such that the dopants of the first conductivity typed are not implanted to lower portions of deposited single crystalline semiconductor material in the first via cavities 169 (i.e., not into the volumes of the second doped extension regions 144). The second mask layer 75 can be subsequently removed, for example, by ashing.

Figure 9:
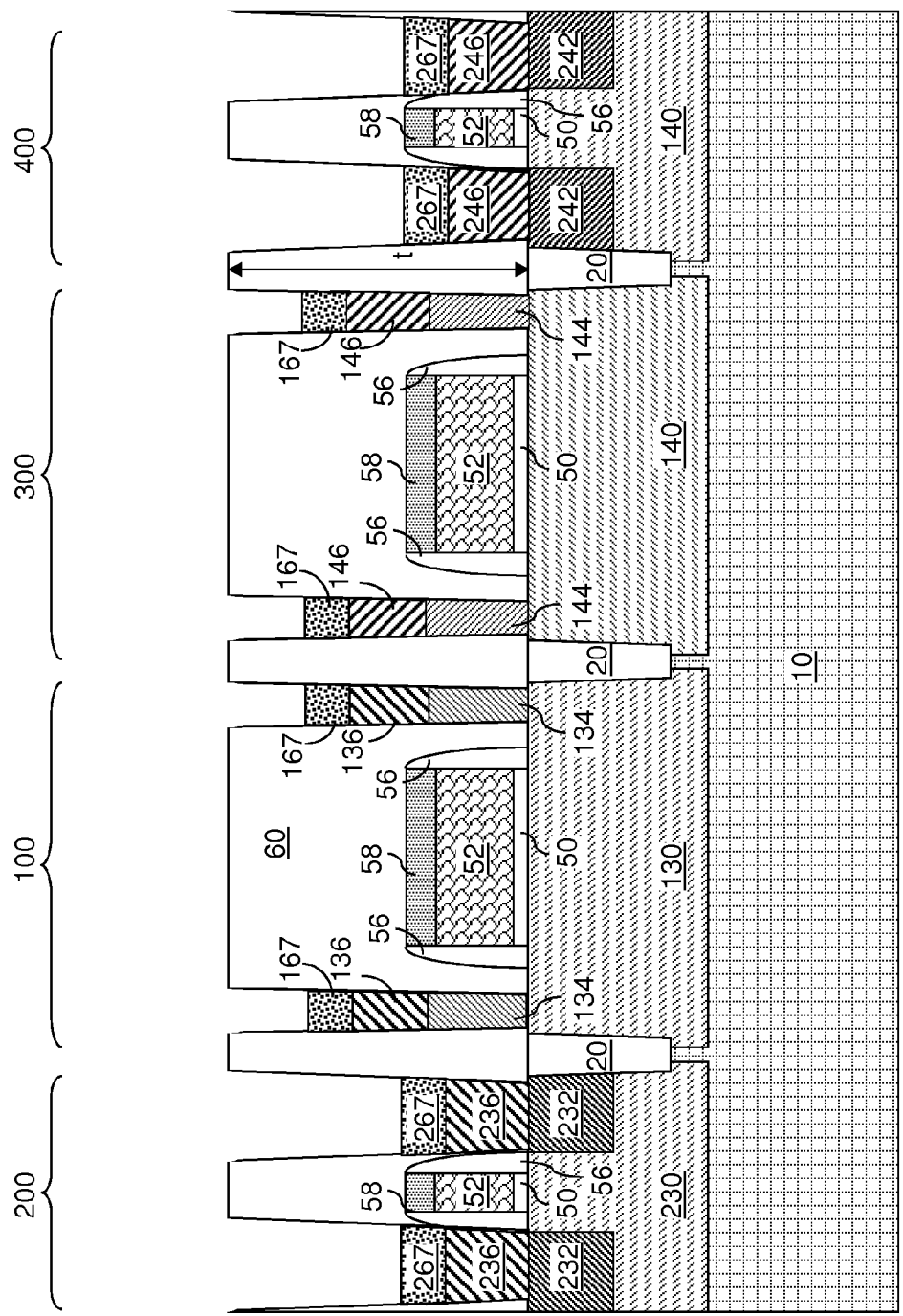
FIG. 9 is a vertical cross-sectional view of the exemplary semiconductor structure after formation of metal-semiconductor alloy portions according to an embodiment of the present disclosure.

Referring to FIG. 9, a metal layer can be deposited on the top surfaces of the first active regions 136, the second active regions 146, the first raised active regions 236, and the second raised active regions 246. The metal layer can include a metal that can form a metal-semiconductor alloy with the semiconductor material of the first active regions 136, the second active regions 146, the first raised active regions 236, and the second raised active regions 246. For example, the semiconductor material of the first active regions 136, the second active regions 146, the first raised active regions 236, and the second raised active regions 246 can include silicon, and the metal layer can include a metal that forms a metal silicide. In one embodiment, the metal layer can include at least one material selected from Ti, Co, Ni, W, and Pt.

An anneal is performed at an elevated temperature to induce formation of a metal-semiconductor alloy. The elevated temperature can be in a range from 500 degrees Celsius to 800 degrees Celsius, although lower and higher temperatures can also be employed. Various metal-semiconductor alloy regions (167, 267) can be formed on the top surfaces of the remaining portions of the first active regions 136, the second active regions 146, the first raised active regions 236, and the second raised active regions 246. The metal-semiconductor alloy regions (167, 267) can include first metal-semiconductor alloy regions 167 that are formed directly on the first active regions 136 or the second active regions 146, and second metal-semiconductor alloy regions 267 that are formed directly on the first raised active regions 236 and the second raised active regions 246. Untreated portions of the metal layer can be removed selective to the metal-semiconductor alloy regions (167, 267), for example, by a wet etch.

Figure 10:
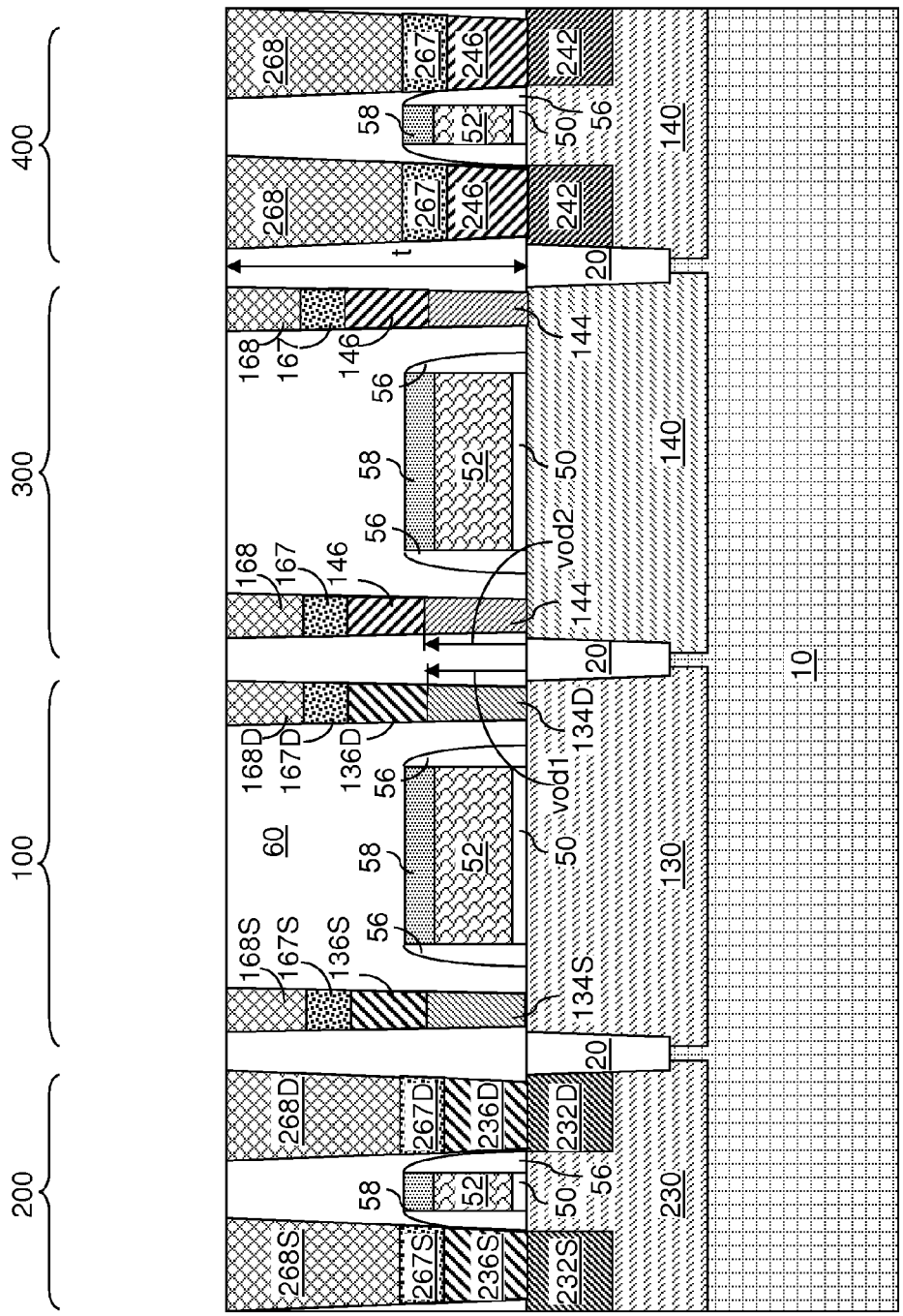
FIG. 10 is a vertical cross-sectional view of the exemplary semiconductor structure after formation of metallic via structures according to an embodiment of the present disclosure.

Referring to FIG. 10, at least one metallic material can be deposited in unfilled volumes of the via cavities (169, 269) and over the contiguous dielectric material layer 60. The at least one metallic material can include, for example, a conductive metallic liner material and a metallic fill material. The conductive metallic liner material can include a conductive metallic nitride (such as TiN, TaN, and/or WN) or a conductive metallic carbide (such as TiC, TaC, and/or WC). The metallic fill material can include, for example, copper, aluminum, or tungsten. Portions of the deposited at least one metallic material can be removed from above a horizontal plane including the top surface of the contiguous dielectric material layer 60 by a planarization process such as chemical mechanical planarization (CMP). Remaining portions of the deposited at least one metallic material comprises various metallic via structures (168, 268), which can include first metallic via structures 168 contacting a respective first metal-semiconductor alloy region 167 and second metallic via structures 268 contacting a respective second metal-semiconductor alloy region 267. In one embodiment, the first metallic via structures 168 can contact, and overlie, a respective first active region 136 or a respective second active region 146. The first metallic via structures 168 include a first source-side metallic via structure overlying a first source region (one of 136), a first drain-side metallic via structure overlying a first drain region (another of 136), a second source-side metallic via structure overlying a second source region (one of 146), and a second drain-side metallic via structure overlying a second drain region (another of 146).

Each via cavity (169, 269) can have a sidewall that is vertical or tapered. Each first metallic via structure 168 (which includes the first source-side metallic via structure and the first drain-side metallic via structure) and each first active region 136 (which includes the first source region and the first drain region) are formed directly on a respective sidewall of a first via cavity 169.

The exemplary semiconductor structure can comprise a first field effect transistor in a first device region 100. The first field effect transistor can comprise a first doped semiconductor well 130 located in a substrate (10), and a first gate stack (50, 52, 58) comprising a gate dielectric 50 and a gate electrode 52 and overlying the first doped semiconductor well 130. The first doped semiconductor well 130 can comprise a channel of the first field effect transistor. The exemplary semiconductor structure can comprise a contiguous dielectric material layer 60 overlying the substrate and laterally surrounding the gate stack (50, 52, 58). A first source-side via cavity (one of 169 in the first device region 100) extends from a bottom surface of the contiguous dielectric material layer 60 to a top surface of the contiguous dielectric material layer 60. A first drain-side via cavity (another of 169 in the first device region 100) extends from the bottom surface of the contiguous dielectric material layer to the top surface of the contiguous dielectric material layer 60. A first source region 136S is located within the first source-side via cavity, and a first drain region 136D is located within the first drain-side via cavity. Each of the first source region 136S and the first drain region 136D has a bottom surface located above, and vertically spaced from, the bottom surface of the contiguous dielectric material layer 60. The first active regions (136S, 136D) can be vertically spaced from the bottom surface of the contiguous dielectric material layer 60 by a first vertical offset distance vod1.

In one embodiment, the first source region 136S can be an upper portion of a first source-side epitaxial pillar structure (134S, 136S), and the first drain region 136D can be an upper portion of a first drain-side epitaxial pillar structure (134D, 136D). The first doped semiconductor well 130 can have a doping of a first conductivity type, and the first active regions (136S, 136D) can have a doping of a second conductivity type that is the opposite of the first conductivity type. In one embodiment, the first source-side epitaxial pillar structure (134S, 136S) comprises a first source-extension region 134S contacting the bottom surface of the first source region 136S, and the first drain-side epitaxial pillar structure (134D, 136D) comprises a first drain-extension region 134D contacting the bottom surface of the first drain region 136D. Optionally, as discussed above for the processing steps of FIG. 1, lightly doped source/drain regions can be provided within upper portions of the first doped semiconductor well 130 that do not underlie the gate stack (50, 52, 58) of the first transistor, and/or lightly doped source/drain regions can be provided within upper portions of the third doped semiconductor well 140 that do not underlie the gate stack (50, 52, 58) of the third transistor. The first source-extension region 134S and the first drain-extension region 134D can have a doping of the same conductivity type as the first source region 136S and the first drain region 136D. The dopant concentration of the first source-extension region 134S and the first drain-extension region 134D can be lower than the dopant concentration of the first source region 134S and the first drain region 134D.

In one embodiment, the exemplary semiconductor structure can comprise a first source-side metallic via structure 168S located in the first source-side via cavity, overlying the first source-side epitaxial pillar structure (134S, 136S), and having a top surface that is planar with the top surface of the contiguous dielectric material layer 60. Further, the exemplary semiconductor structure can comprise a first drain-side metallic via structure 168D located in the first drain-side via cavity, overlying the first drain-side epitaxial pillar structure (134D, 136D), and having a top surface that is planar with the top surface of the contiguous dielectric material layer 60.

Each via cavity is vertical or tapered. Thus, the first source region 136S can have a horizontal cross-sectional shape that is entirely contained within a horizontal cross-sectional shape of the first source-side metallic via structure 168S, and the first drain region 136D can have a horizontal cross-sectional shape that is entirely contained within a horizontal cross-sectional shape of the first drain-side metallic via structure 168D. The exemplary semiconductor structure can further comprise a first source-side metal-semiconductor alloy portion 167S contacting a top surface of the first source region 136S and a bottom surface of the first source-side metallic via structure 168S, and a first drain-side metal-semiconductor alloy portion 167D contacting a top surface of the first drain region 136D and a bottom surface of the first drain-side metallic via structure 168D.

In one embodiment, a first p-n junction can be located between the first doped semiconductor well 130 and the first source-side epitaxial pillar structure (134S, 136S), and a second p-n junction can be located between the first doped semiconductor well 130 and the first drain-side epitaxial pillar structure (134D, 136D).

The exemplary semiconductor structure can further comprise a second field effect transistor in the second device region 200. The second field effect transistor can comprise a second doped semiconductor well 230 located in the substrate, and a second gate stack (50, 52, 58) comprising another gate dielectric 50 and another gate electrode 52 and overlying the second doped semiconductor well 230. The second doped semiconductor well 230 can comprise a channel of the second field effect transistor. The exemplary semiconductor structure can comprise a second source-side via cavity 269 extending from the bottom surface of the contiguous dielectric material layer 60 to the top surface of the contiguous dielectric material layer 60, a second drain-side via cavity 269 extending from the bottom surface of the contiguous dielectric material layer 60 to the top surface of the contiguous dielectric material layer 60, a raised source region 236S located within the second source-side via cavity, and a raised drain region 236D located within the second drain-side via cavity.

In one embodiment, the top surface of the first doped semiconductor well 130 and the top surface of the second doped semiconductor well 230 can be located within the same horizontal plane. In one embodiment, the first source region 136S, the first drain region 136D, the raised source region 236S, and the raised drain region 236D comprise the same doped semiconductor material.

In one embodiment, the first source region 136S can be an upper portion of a first source-side epitaxial pillar structure (134S, 136S), the first drain region 136D can be an upper portion of a first drain-side epitaxial pillar structure (134D, 136D), the raised source region 236S can be an entirety of a second source-side epitaxial pillar structure, the raised drain region 236D can be an entirety of a second drain-side epitaxial pillar structure, and the first source-side epitaxial pillar structure (134S, 136S) and the first drain-side epitaxial pillar structure (134D, 136D) can have a greater thickness than the second source-side epitaxial pillar structure 236S and the second drain-side epitaxial pillar structure 236D.

In one embodiment, the first doped semiconductor well 130 can have a doping of a first conductivity type, the first source region 136S and the first drain region 136D can have a doping of a second conductivity type that is the opposite of the first conductivity type, and the raised source region 236S and the raised drain region 236D can have a doping of the opposite conductivity type with respect to the second doped semiconductor well 230.

In one embodiment, the first source-side epitaxial pillar structure (134S, 136S) can comprise a first source-extension region 134S contacting the bottom surface of the first source region 136S, and the first drain-side epitaxial pillar structure (134D, 136D) can comprise a first drain-extension region 134D contacting the bottom surface of the first drain region 136D. The first source-extension region 134S and the first drain-extension region 134D can have a doping of the same conductivity type as the first source region 136S and the first drain region 136D. The dopant concentration of the first source-extension region 134S and the first drain-extension region 134D can be lower than the dopant concentration of the first source region 136S and the first drain region 136D.

In one embodiment, a first source-side metallic via structure 168S is located in the first source-side via cavity, overlies the first source-side epitaxial pillar structure (134S, 136S), and has a top surface that is planar with the top surface of the contiguous dielectric material layer 60. A first drain-side metallic via structure 168D is located in the first drain-side via cavity, overlies the first drain-side epitaxial pillar structure (134D, 136D), and has a top surface that is planar with the top surface of the contiguous dielectric material layer 60. A second source-side metallic via structure 268S is located in the second source-side via cavity, overlies the second source-side epitaxial pillar structure 236S, and has a top surface that is planar with the top surface of the contiguous dielectric material layer 60. A second drain-side metallic via structure 268D is located in the second drain-side via cavity, overlies the second drain-side epitaxial pillar structure 236D, and has a top surface that is planar with the top surface of the contiguous dielectric material layer 60. In one embodiment, bottom surfaces of the first source-side metallic via structure 168S and the first drain-side metallic via structure 168D are more distal from the top surface of the substrate than bottom surfaces of the second source-side metallic via structure 268S and the second drain-side metallic via structure 268D are from the top surface of the substrate.

In one embodiment, the first source region 136S can have a horizontal cross-sectional shape that is entirely contained within a horizontal cross-sectional shape of the first source-side metallic via structure 168S, and the first drain region 136D can have a horizontal cross-sectional shape that is entirely contained within a horizontal cross-sectional shape of the first drain-side metallic via structure 168D. The raised source region 236S can have a horizontal cross-sectional shape that is entirely contained within a horizontal cross-sectional shape of the second source-side metallic via structure 268S, and the raised drain region 236D can have a horizontal cross-sectional shape that is entirely contained within a horizontal cross-sectional shape of the second drain-side metallic via structure 268D.

In one embodiment, a first source-side metal-semiconductor alloy portion 167S contacts a top surface of the first source region 136S and a bottom surface of the first source-side metallic via structure 168S, and a first drain-side metal-semiconductor alloy portion 167D contacts a top surface of the first drain region 136D and a bottom surface of the first drain-side metallic via structure 168D. A second source-side metal-semiconductor alloy portion 267S contacts a top surface of the raised source region 236S and a bottom surface of the second source-side metallic via structure 268S, and a second drain-side metal-semiconductor alloy portion 267D contacts a top surface of the raised drain region 236D and a bottom surface of the second drain-side metallic via structure 268D. The first and second source-side metal-semiconductor alloy portions (167S, 267S) and the first and second drain-side metal-semiconductor alloy portion (167D, 267D) can have the same composition and the same thickness (which can be in a range from 1 nm to 30 nm).

The exemplary semiconductor structure can comprise an embedded source region 232S embedded within the second doped semiconductor well 230, located underneath a top surface of the substrate, and contacting a bottom surface of the raised source region 236S. Further, the exemplary semiconductor structure can comprise an embedded drain region 232D embedded within the second doped semiconductor well 230, located underneath the top surface of the substrate, and contacting a bottom surface of the raised drain region 236D.

In one embodiment, each of the raised source region 236S and the raised drain region 236D has a greater horizontal cross-sectional area than any horizontal cross-sectional area of the first source region 136S or the first drain region 136D. In one embodiment, the first source region 136S, the first drain region 136D, the raised source region 236S, and the raised drain region 236D can have the same composition.

Figure 11:
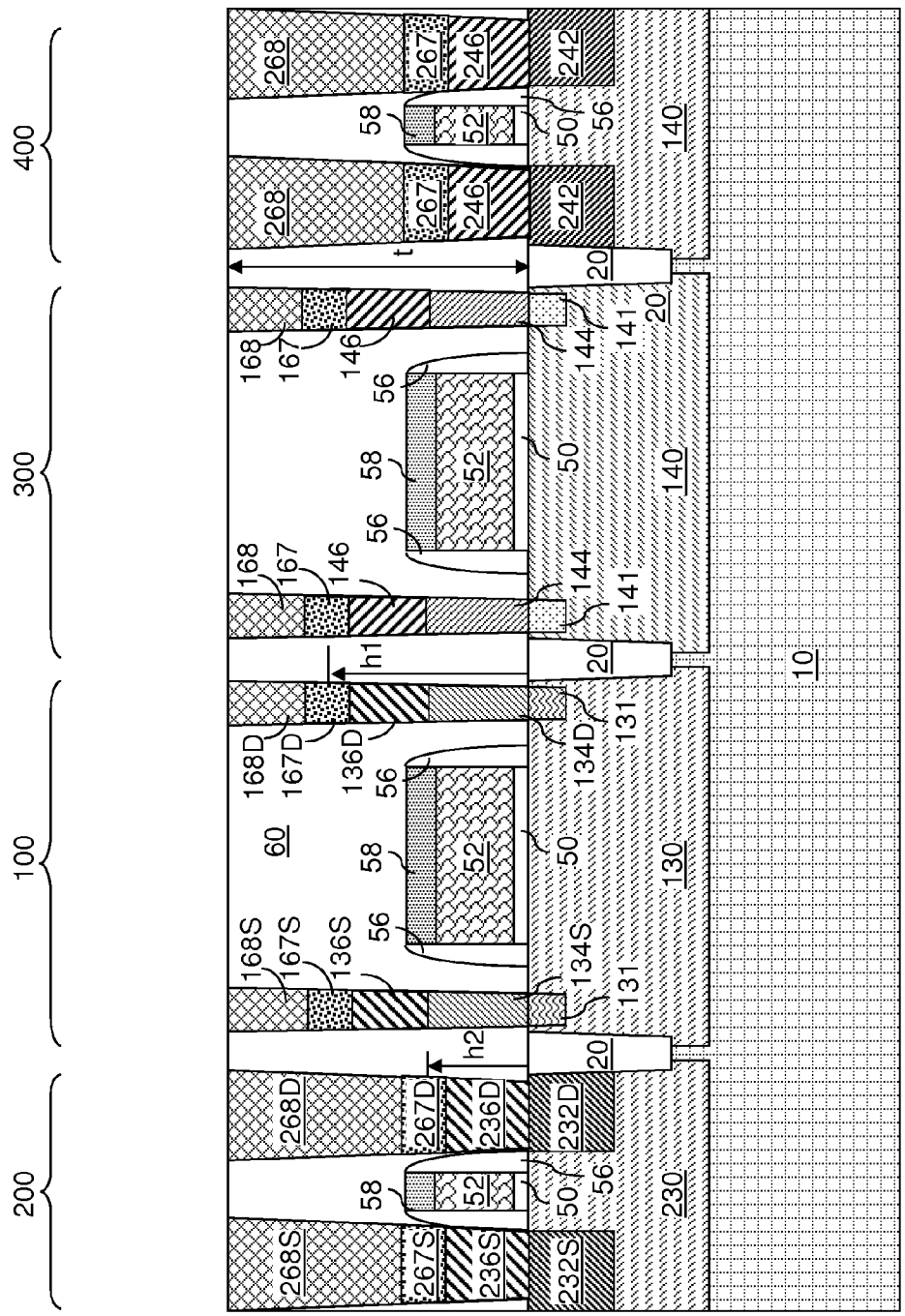
FIG. 11 is a vertical cross-sectional view of a first alternative embodiment of the exemplary semiconductor structure.

Referring to FIG. 11, a first alternative embodiment of the exemplary semiconductor structure is shown. The first alternative embodiment of the exemplary semiconductor structure can be derived from the exemplary semiconductor structure by forming the epitaxial pillar structures (6A, 6B) in the first and second device regions (100, 200) as undoped semiconductor material portions or lightly doped semiconductor material portions having a doping of the first conductivity type (at a dopant concentration in a range from $1.0 \times 10^{15}/cm^3$ to $1.0 \times 10^{19}/cm^3$) at a processing step corresponding to FIG. 6, and by implanting dopants of the second conductivity type in lower portions of the first epitaxial pillar structures 6A in the first device region 100 to form first doped extension regions (134S, 134D) (which include a first source-extension region 134S and a first drain-extension region 134D) at a processing step corresponding to FIG. 7. If a fraction of the dopants of the second conductivity type is implanted into upper portions of the first doped semiconductor well 130, first embedded extension regions 131 having a doping of the second conductivity type can be formed by converting surface portions of the first doped semiconductor well 130 into regions having a doping of the second conductivity type. Optionally, as discussed above for the processing steps of FIG. 1, lightly doped source/drain regions can be provided within upper portions of the first doped semiconductor well 130 that do not underlie the gate stack (50, 52, 58) of the first transistor, and/or lightly doped source/drain regions can be provided within upper portions of the third doped semiconductor well 140 that do not underlie the gate stack (50, 52, 58) of the third transistor.

Alternatively or additionally, the epitaxial pillar structures (6A, 6B) in the third and fourth device regions (300, 400) can be formed as undoped semiconductor material portions or lightly doped semiconductor material portions having a doping of the second conductivity type (at a dopant concentration in a range from $1.0 \times 10^{15}/cm^3$ to $1.0 \times 10^{19}/cm^3$) at a processing step corresponding to FIG. 6. Dopants of the first conductivity type can be implanted in lower portions of the first epitaxial pillar structures 6A in the third device region 300 to form second doped extension regions 144 (which include a second source-extension region and a second drain-extension region) at a processing step corresponding to FIG. 8. If a fraction of the dopants of the first conductivity type is implanted into upper portions of the third doped semiconductor well 140, second embedded extension regions 141 having a doping of the first conductivity type can be formed by converting surface portions of the third doped semiconductor well 140 into regions having a doping of the first conductivity type.

In this case, a first p-n junction can be located underneath the first source region 136S and below a horizontal plane including a top surface of the first doped semiconductor well 130, and a second p-n junction can be located underneath the first drain region 136D and below the horizontal plane including the top surface of the first doped semiconductor well 130.

Figure 12:
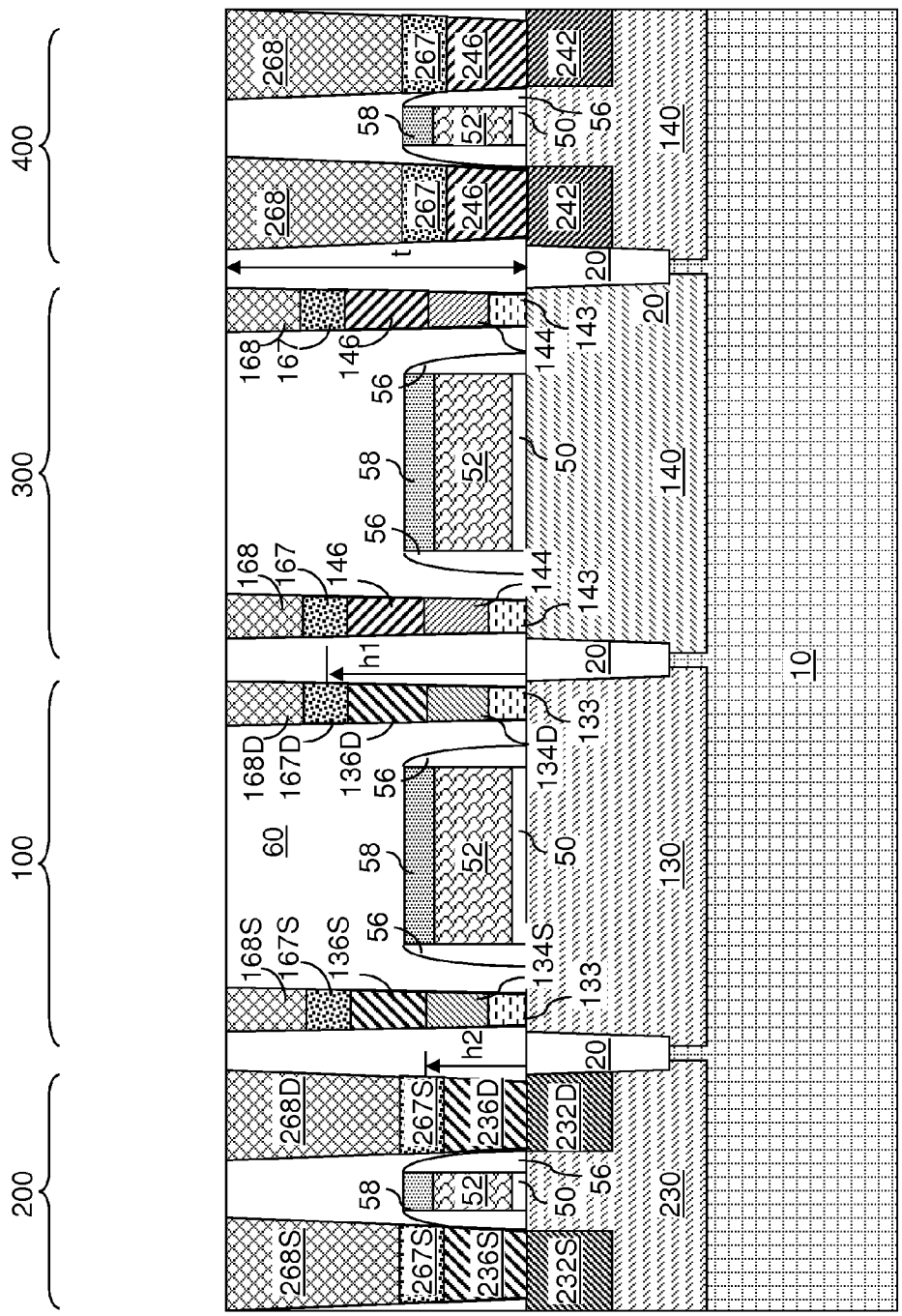
FIG. 12 is a vertical cross-sectional view of a second alternative embodiment of the exemplary semiconductor structure.

Referring to FIG. 12, a second alternative embodiment of the exemplary semiconductor structure is shown. The second alternative embodiment of the exemplary semiconductor structure can be derived from the exemplary semiconductor structure by forming the epitaxial pillar structures (6A, 6B) in the first and second device regions (100, 200) as lightly doped semiconductor material portions having a doping of the first conductivity type (at a dopant concentration in a range from $1.0 \times 10^{15}/cm^3$ to $1.0 \times 10^{19}/cm^3$) at a processing step corresponding to FIG. 6, and by implanting dopants of the second conductivity type in lower portions of the first epitaxial pillar structures 6A in the first device region 100 to form first doped extension regions (134S, 134D) (which include a first source-extension region 134S and a first drain-extension region 134D) at a processing step corresponding to FIG. 7. The energy of the implanted dopants of the second conductivity type is controlled such that the bottom surfaces of the first doped extension regions (134S, 134D) are formed above the horizontal plane including the top surface of the substrate. In this case, first raised channel regions 133 having a doping of the first conductivity type can be formed at a bottommost portion of the first via cavities in the first device region 100.

Alternatively or additionally, the epitaxial pillar structures (6A, 6B) in the third and fourth device regions (300, 400) can be formed as lightly doped semiconductor material portions having a doping of the second conductivity type (at a dopant concentration in a range from $1.0 \times 10^{15}/cm^3$ to $1.0 \times 10^{19}/cm^3$) at a processing step corresponding to FIG. 6. Dopants of the first conductivity type can be implanted in lower portions of the first epitaxial pillar structures 6A in the third device region 300 to form second doped extension regions 144 (which include a second source-extension region and a second drain-extension region) at a processing step corresponding to FIG. 8. The energy of the implanted dopants of the first conductivity type is controlled such that the bottom surfaces of the second doped extension regions 144 are formed above the horizontal plane including the top surface of the substrate. In this case, second raised channel regions 143 having a doping of the second conductivity type can be formed at a bottommost portion of the first via cavities in the third device region 300.

In this case, a first p-n junction can be located underneath the first source region 136S and above a horizontal plane including a top surface of the first doped semiconductor well 130, and a second p-n junction can be located underneath the first drain region 136D and above the horizontal plane including the top surface of the first doped semiconductor well 130.

Figure 13:
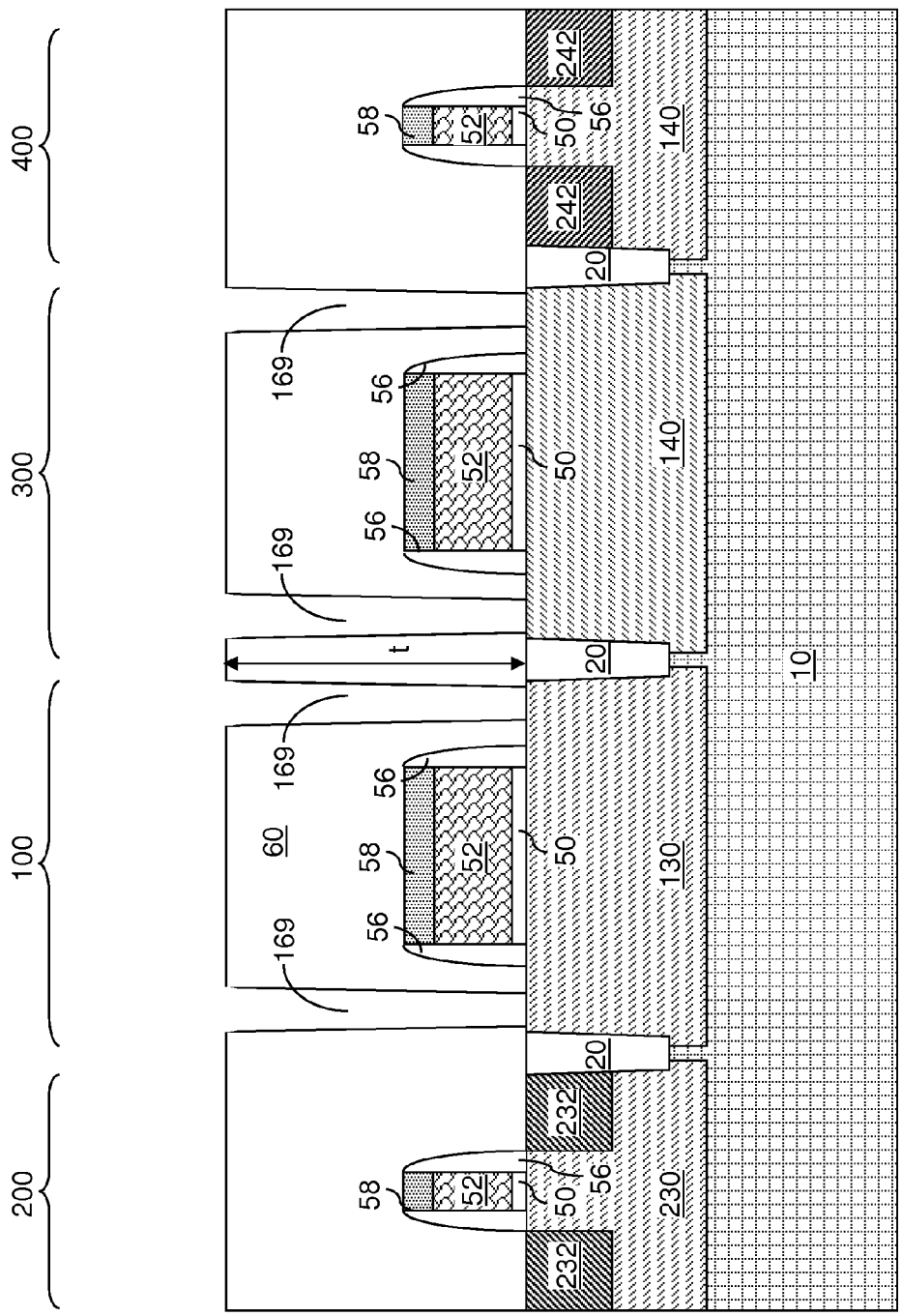
FIG. 13 is a vertical cross-sectional view of a third alternative embodiment of the exemplary semiconductor structure after formation of via cavities.

Referring to FIG. 13, a third alternative embodiment of the exemplary semiconductor structure can be formed by forming the first via cavities 169 first, and subsequently forming the second via cavities 269. Specifically, only the first via cavities 169 are formed at the processing step of FIG. 5. Subsequently, the processing steps of FIGS. 7 and 8 are performed without forming any second via cavities 269, any second epitaxial pillar structures 6B, any first raised active regions 236, or any second raised active regions 246.

Figure 14:
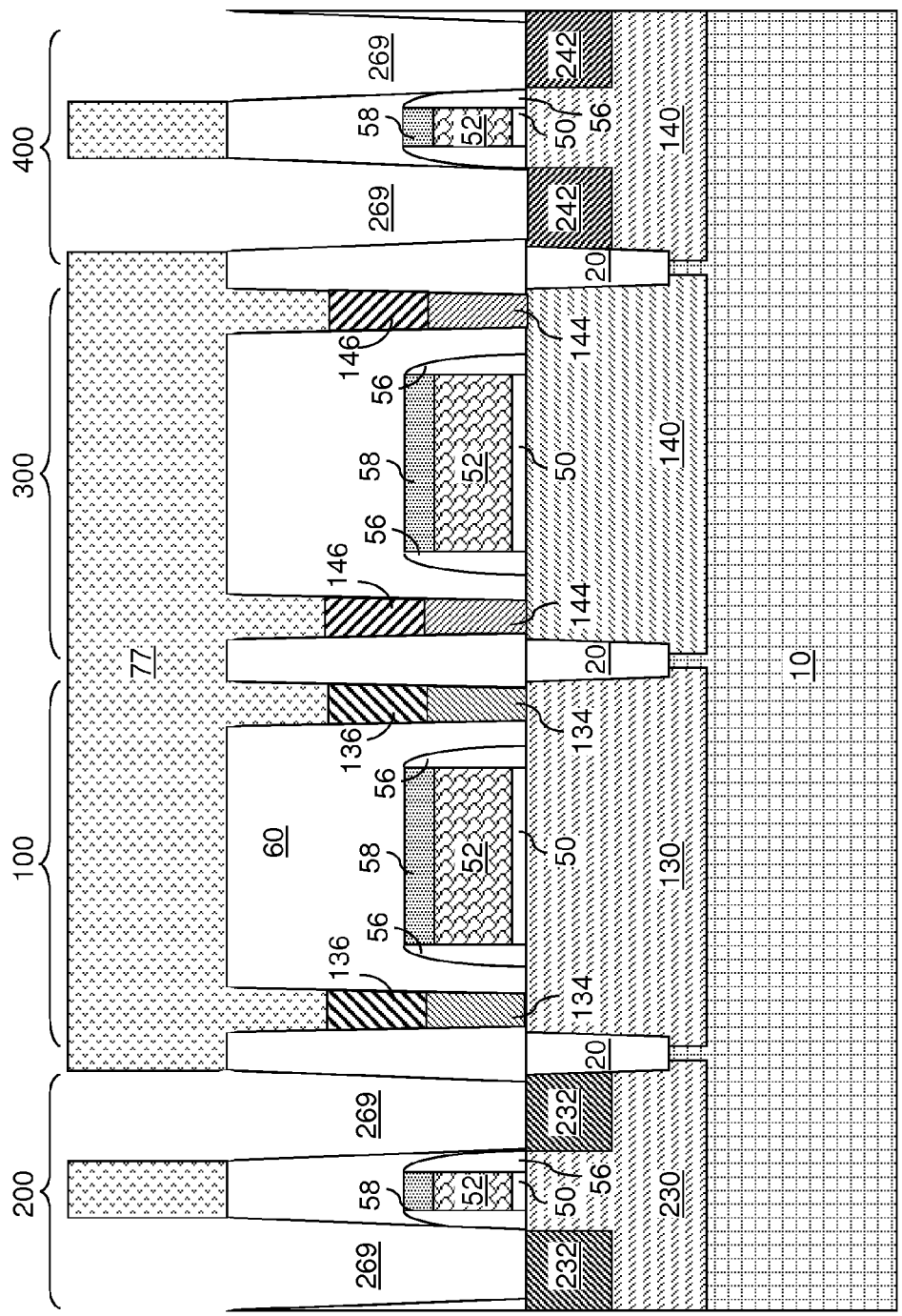
FIG. 14 is a vertical cross-sectional view of the third alternative embodiment of the exemplary semiconductor structure after formation of elevated active regions and additional via cavities.

Subsequently, a photoresist layer 77 is applied over the exemplary structure and is lithographically patterned to form openings in areas for second via cavities 269, i.e., in areas overlying the first and second embedded active regions (232, 242), as shown in FIG. 14. An anisotropic etch is performed employing the patterned photoresist layer 77 as an etch mask to form second via cavities 269 in volumes corresponding to the volumes of the second via cavities in FIG. 5. The photoresist layer 77 can be subsequently removed, for example, by ashing.

Figure 15:
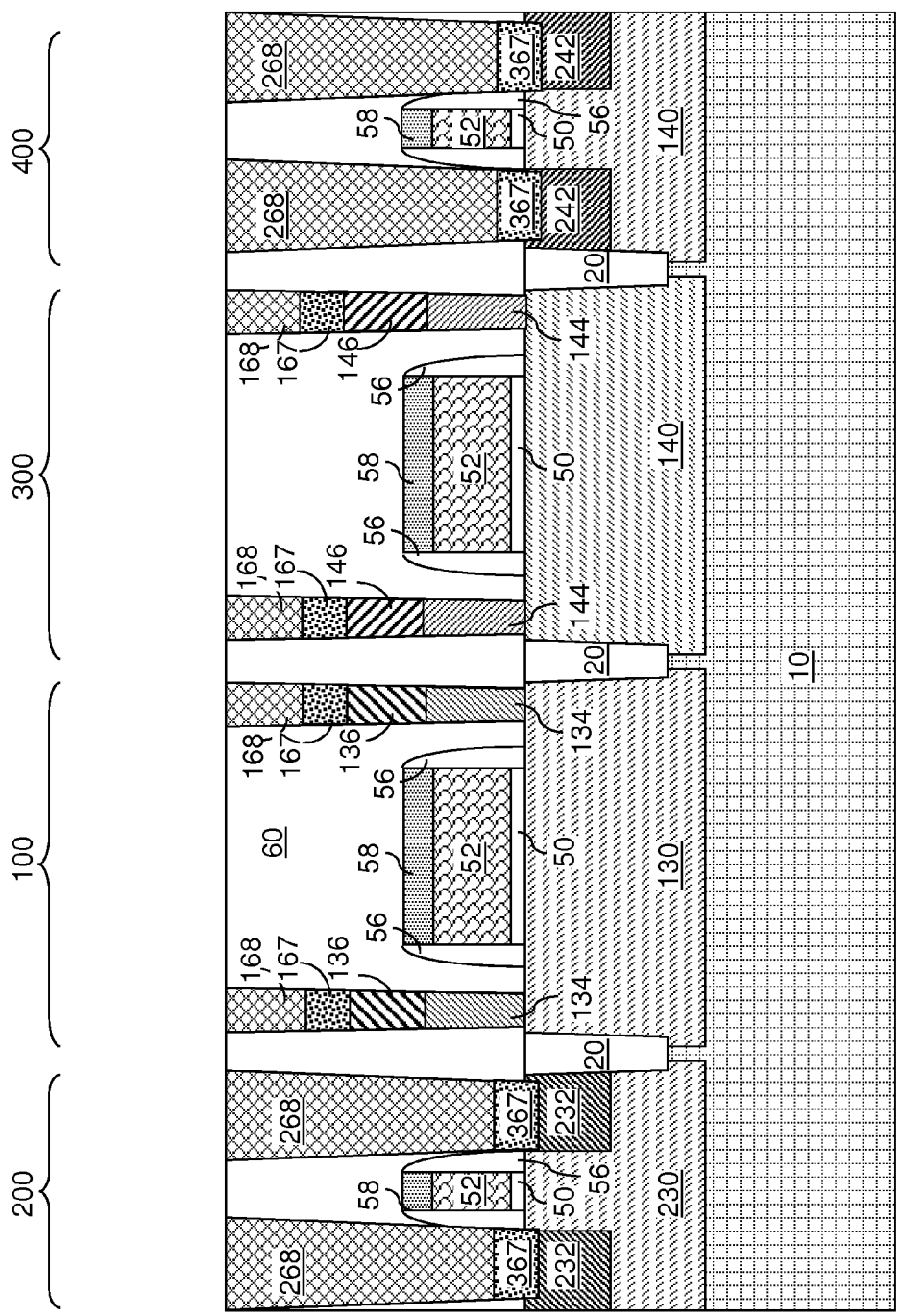
FIG. 15 is a vertical cross-sectional view of the third alternative embodiment of the exemplary semiconductor structure after formation of metallic via structures.

Referring to FIG. 15, the processing steps of FIGS. 9 and 10 can be performed to form various metal-semiconductor alloy regions (167, 367) and various metallic via structures (168, 268). The metal-semiconductor alloy regions (167, 367) comprise first metal-semiconductor alloy regions 167 that are formed directly on the first active regions 136 or the second active regions 146, and second metal-semiconductor alloy regions 367 that are formed directly on the first embedded active regions 232 and the second embedded active regions 242. The bottom surfaces of the second metal-semiconductor alloy regions 367 can be below the horizontal plane including the top surface of the substrate.

The field effect transistors formed in the first and third device regions (100, 300) can have an effective channel length that is greater than the physical separation distance between a pair of first via cavities adjacent to the respective gate stack (50, 52, 58) of the field effect transistors. In other words, the effective channel length can be the sum of the lateral separation distance between a pair of first via cavities adjacent to the respective gate stack (50, 52, 58) of the field effect transistor and an effective vertical channel distance induced by light doping of the doped extension regions (134, 144). Thus, a high voltage device having a long effective channel length can be provided without proportionally extending the physical distance between a pair of via cavities in which contact structures (167, 168) are formed. A high voltage device with a long channel length can be provided employing a physical lateral separation distance between via cavities that is the less than the channel length.

Figure 16:
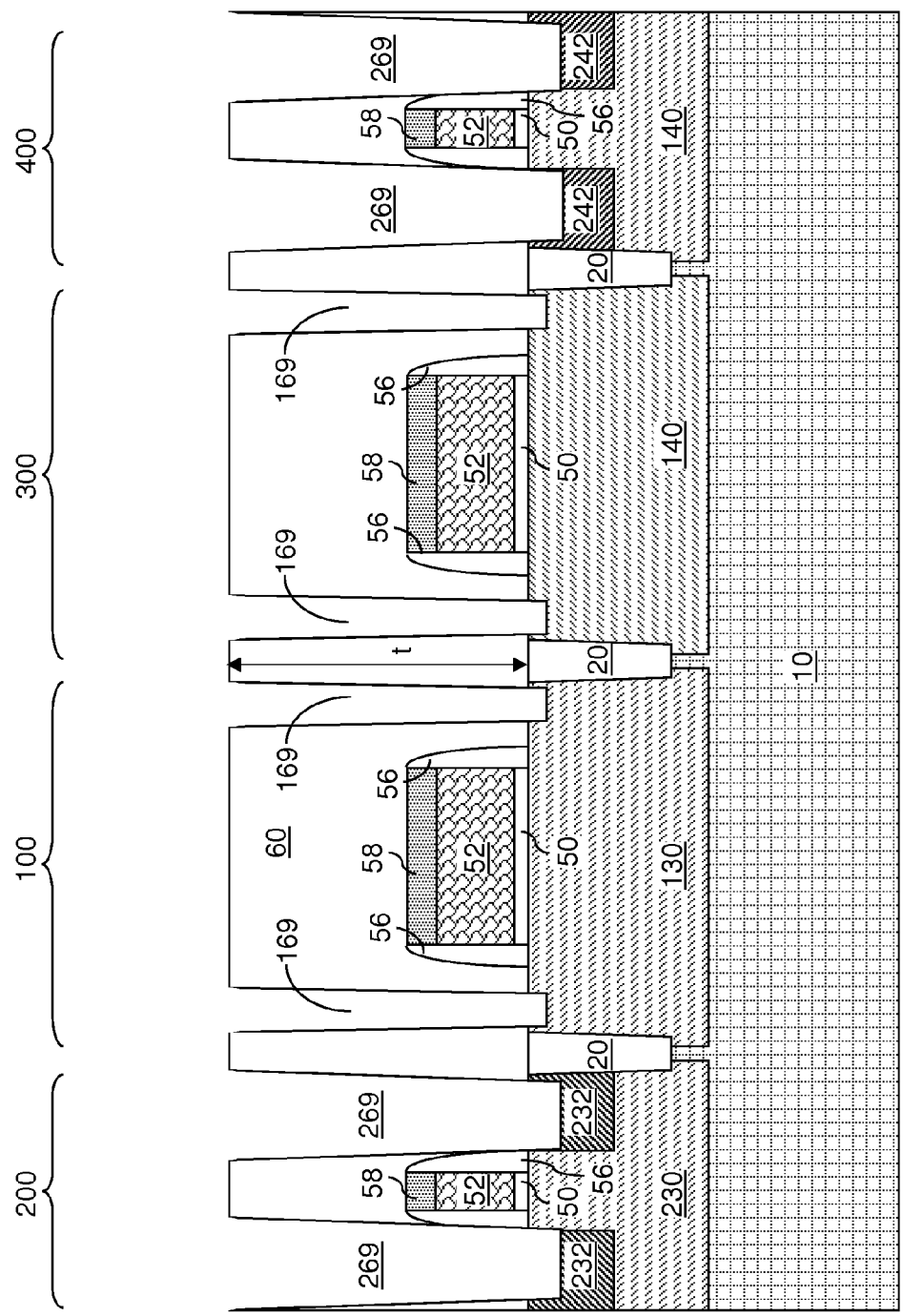
FIG. 16 is a vertical cross-sectional view of a fourth alternative embodiment of the exemplary semiconductor structure after formation of via cavities through the contiguous dielectric material layer according to an embodiment of the present disclosure.

Referring to FIG. 16, a fourth alternative embodiment of the exemplary semiconductor structure according to an embodiment of the present disclosure can be derived from the exemplary semiconductor structure. Specifically, the anisotropic etch that forms the via cavities (169, 269) is followed by another anisotropic etch that etches the semiconductor materials of the first and third doped semiconductor wells (130, 140) and the embedded active regions (232, 242). The resulting via cavities (169, 269) extend into upper portions of the first and third doped semiconductor wells (130, 140) and the embedded active regions (232, 242). The larger the horizontal cross-sectional area of each via cavity (169, 269) is, the higher the etch rate of the semiconductor material is during vertical extension of the via cavities (169, 269) due to limitations in the transport of etchant radicals within the via cavities (169, 269) during the anisotropic etch. Thus, the wider second via cavities 269 extend farther into the embedded active regions (132, 142) than the narrower first via cavities 169 extend into the first and third doped semiconductor wells (130, 140). In other words, the bottom of the wider cavities 269 is located closer to the substrate 10 than the bottom of the narrower cavities. The differential in the heights of the bottom surfaces of the second via cavities 269 with respect to the bottom surfaces of the first via cavities 169 can be advantageously employed to optimize the height of the top surface of each epitaxial pillar structure (6A, 6B).

Figure 17:
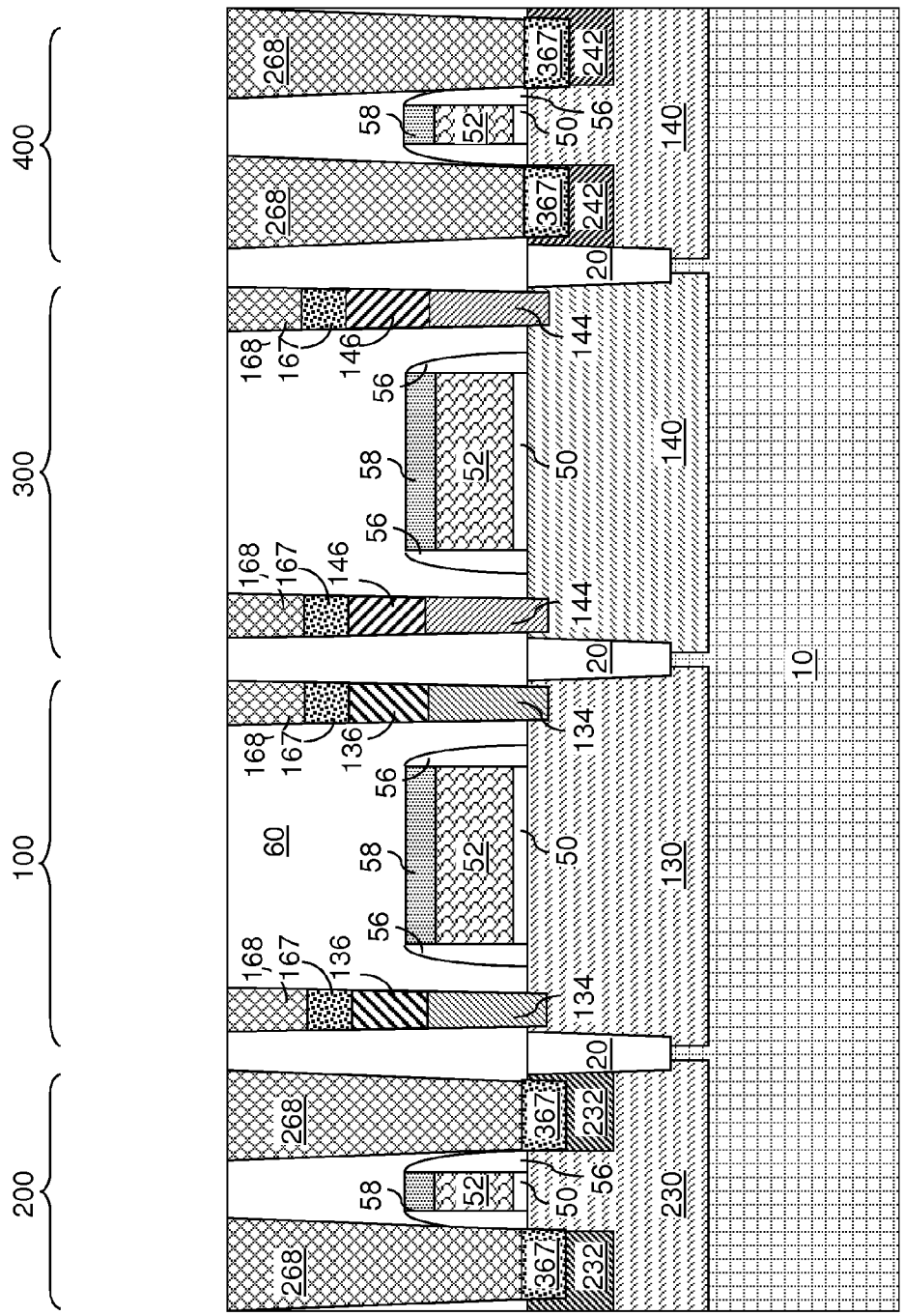
FIG. 17 is a vertical cross-sectional view of the fourth alternative embodiment of the exemplary semiconductor structure after formation of metallic via structures.

Referring to FIG. 17, the processing steps of FIGS. 6-10 or alternative methods thereof can be employed to form transistors and metallic via structures. The structures 367/268 located in the wider cavities 268 extend deeper into regions (232, 242) in wells (230, 240) than the structures (134, 144)/(136,146)/167/168 located in the narrower wells 169 extend into wells (130, 140). In other words, the bottom of regions 367 is closer to the substrate 10 than the bottom of regions (134, 144).

Figure 18:
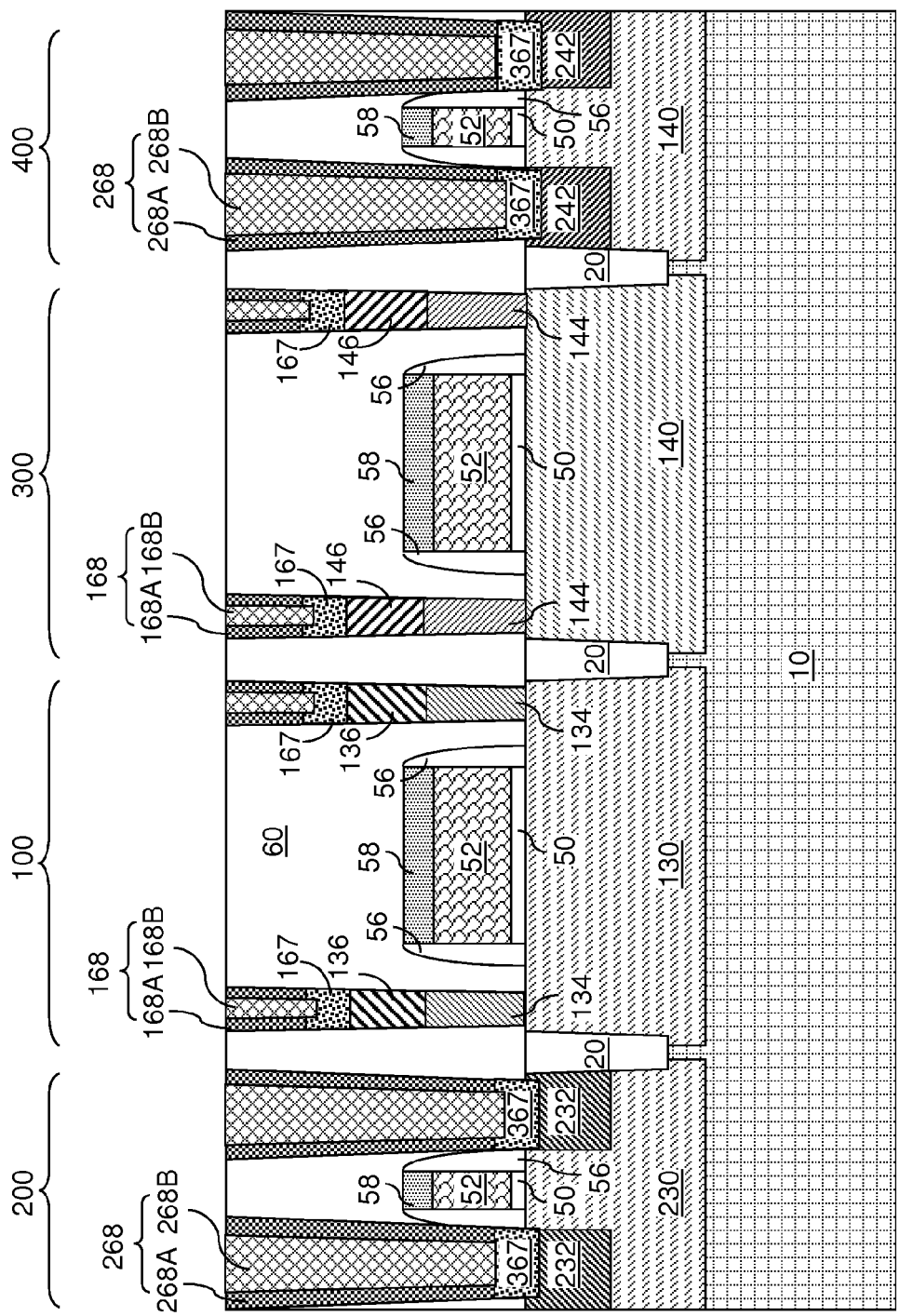
FIG. 18 is a vertical cross-sectional view of a fifth alternative embodiment of the exemplary semiconductor structure after formation of metallic via structures.

Referring to FIG. 18, a fifth alternative embodiment of the exemplary semiconductor structure can be derived from the exemplary structure of FIG. 8 by removing the second mask layer 75, depositing a metal layer including a metal that forms a metal semiconductor alloy with the semiconductor materials of the first and second active regions (136, 146) and the embedded active regions (232, 242), forming various metal-semiconductor alloy regions (167, 367) (e.g., metal silicide) by inducing reaction of the metal and the semiconductor materials underneath, and not removing the remaining portions of the metal layer. Each remaining portions of the metal layer constitutes a metallic liner (168A, 268A) including the same metal as the metal-semiconductor alloy regions (167, 367), and not including a semiconductor material. Subsequently, metallic fill material portions (168B, 268B) are formed within each unfilled portion of the via cavities to form metallic via structures (168, 268). The metallic via structures (168, 268) include first metallic via structures 168, each of which includes a first metallic liner 168A and a first metallic fill material portion 168B. The metallic via structures (168, 268) include second metallic via structures 268, each of which includes a second metallic liner 268A and a second metallic fill material portion 268B.

Any subset of transistors provided by the present disclosure can be employed in any complementary metal-oxide-semiconductor (CMOS) circuitry, p-type metal-oxide-semiconductor (PMOS) circuitry, or n-type metal-oxide-semiconductor (NMOS) circuitry. In an illustrative example, the transistors of the present disclosure can be employed in a peripheral circuitry that controls the operation of memory cells in any memory device including two-dimensional and three-dimensional memory devices (including vertical NAND memory devices).

Figure 19:
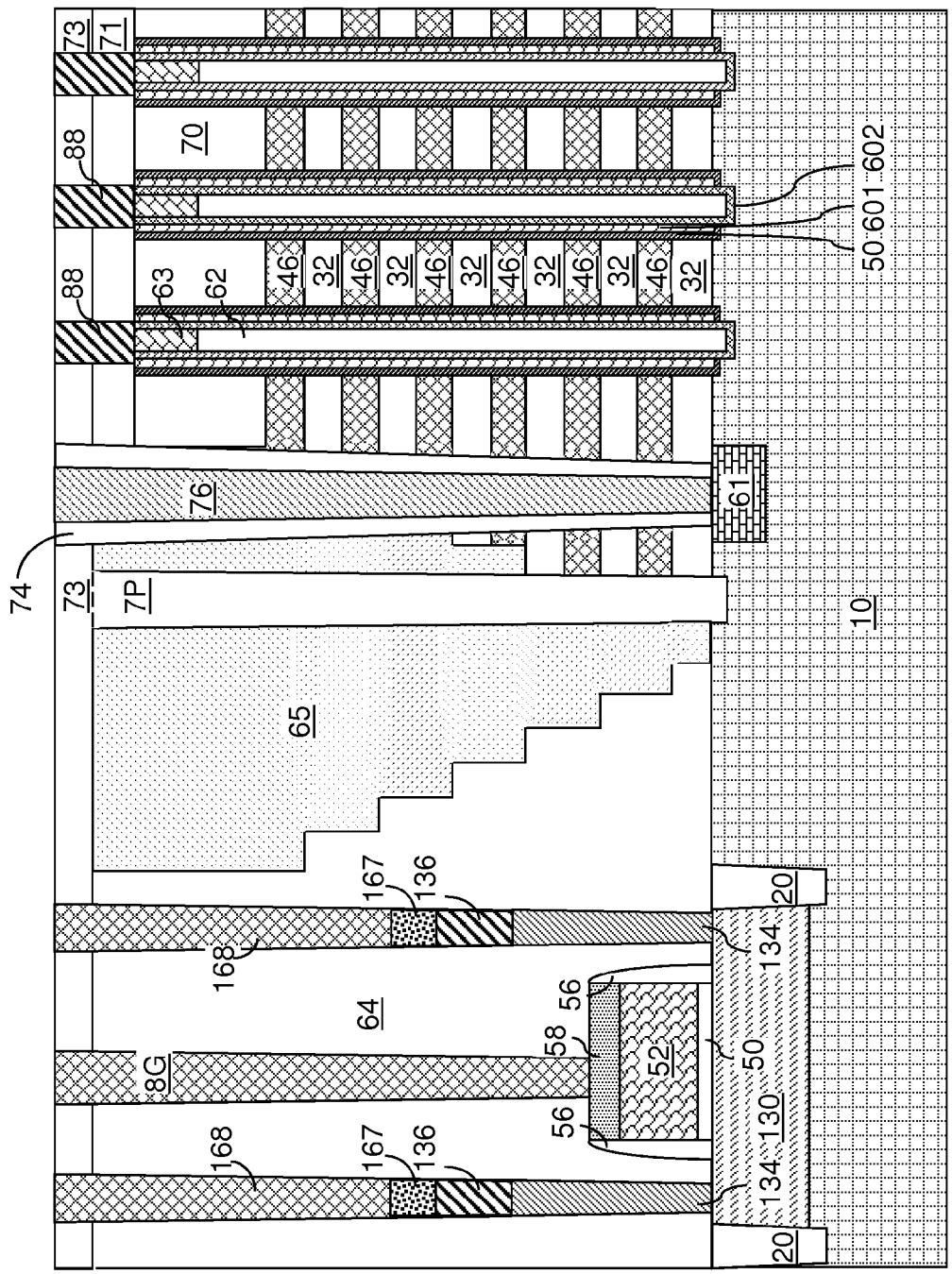
FIG. 19 is a vertical cross-sectional view of an exemplary three-dimensional NAND memory device incorporating at least one transistor of the present disclosure.

FIG. 19 illustrates an exemplary three-dimensional NAND memory device incorporating at least one transistor of the present disclosure. While only a single transistor, i.e., a first transistor formed in a first device region 100, of the present disclosure is illustrated as a peripheral device in the exemplary three-dimensional NAND memory device of FIG. 19, the various transistors of the present disclosure may be incorporated in any combination, and/or with any multiplicity, into the exemplary three-dimensional NAND memory device of FIG. 19 or into any other type of CMOS, PMOS, or NMOS circuits.

For example, a three-dimensional memory device incorporating at least one transistor of the present disclosure can include a stack of alternating layers (32, 46) comprising insulator layers 32 and electrically conductive layers 46 and located over a substrate 10, a memory opening extending through the stack, and a memory film 50 and a semiconductor channel (601, 602) located within the memory opening. A dielectric core 62 can be provided in the semiconductor channel (601, 602), and a memory drain region 63 can be provided in an upper portion of the memory opening. A memory source region 61 can be formed in an upper portion of the substrate 10. The portion of the substrate between the memory source region 61 and each semiconductor channel (601, 602) can function as a horizontal channel. The memory source region 61 can be contacted by a source contact structure 76, which can be electrically isolated laterally by an insulating spacer 74. Memory contact via structures 88 can contact the memory drain regions 63.

Various dielectric material portions or layers (64, 65, 7P, 71, 73) can be employed to form the three-dimensional memory device. The combination of a subset (64, 73) of the dielectric material portions or layers (64, 65, 7P, 71, 73) can be employed in lieu of the contiguous dielectric material layer 60. In a three-dimensional memory device, the electrically conductive layers 46 comprise a first control gate electrode located in a first device level, and a second control gate electrode located in a second device level that is located below the first device level.

In one embodiment, any of the transistors of the present disclosure can comprise a portion of a peripheral circuit of a NAND memory device. In one embodiment, the first field effect transistor can comprise a high voltage wordline switch transistor located in a row decoder region of the NAND memory device, and the second field effect transistor comprises a low voltage transistor configured to operate at a lower voltage than the first field effect transistor and having a shorter gate length than the first field effect transistor. Alternatively, the transistor(s) described above may be located in the bit line driver circuit in addition to or instead of the word line driver circuit.

In one embodiment, the NAND memory device comprises a vertical NAND device located over the substrate 10, the substrate 10 can comprises a silicon substrate, and the vertical NAND device comprises an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon. The driver circuit can be a part of a peripheral circuitry, and can contain one or more of any of the transistors of the present disclosure.

In one embodiment, the array of monolithic three-dimensional NAND strings can comprise: a plurality of semiconductor channels (601, 602), wherein at least one end portion of each of the plurality of semiconductor channels (601, 602) extends substantially perpendicular to a top surface of the substrate 10; a plurality of charge storage elements located at each level of the memory film 50 corresponding to the control gate electrodes (as embodied as the electrically conductive layers 46), each charge storage element located adjacent to a respective one of the plurality of semiconductor channels (601, 602); and a plurality of control gate electrodes (as embodied as the electrically conductive layers 46) having a strip shape extending substantially parallel to the top surface of the substrate 10. The plurality of control gate electrodes can comprise at least a first control gate electrode located in the first device level and a second control gate electrode located in the second device level.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

The invention claimed is:
1. A semiconductor structure comprising:
a gate dielectric and a gate electrode overlying a channel of a first field effect transistor, wherein the channel comprises a surface portion of a first doped semiconductor well having a doping of a first conductivity type throughout and having a top surface located within a horizontal plane;
a gate spacer laterally surrounding the gate electrode;
a contiguous dielectric material layer laterally surrounding the gate electrode;
a first source-side via cavity extending from a bottom surface of the contiguous dielectric material layer to a top surface of the contiguous dielectric material layer and adjoined to the top surface of the first doped semiconductor well;
a first drain-side via cavity extending from the bottom surface of the contiguous dielectric material layer to the top surface of the contiguous dielectric material layer and adjoined to the top surface of the first doped semiconductor well;
a first source-side epitaxial pillar structure located entirely within the first source-side via cavity, having a doping of a second conductivity type that is the opposite of the first conductivity type throughout, and including a first source region therein; and
a first drain-side epitaxial pillar structure located entirely within the first drain-side via cavity, having a doping of the second conductivity type throughout, and including a first drain region therein, wherein:
a first p-n junction is located between the channel and the first source-side epitaxial pillar structure;
a second p-n junction is located between the channel and the first drain-side epitaxial pillar structure;
the first p-n junction and the second p-n junction are located entirely above, and are vertically spaced from, the horizontal plane including the top surface of the first doped semiconductor well; and
a second field effect transistor that comprises:
a second doped semiconductor well located in the substrate;
a second gate stack comprising another gate dielectric and another gate electrode and overlying the second doped semiconductor well, the second doped semiconductor well comprising a channel of the second field effect transistor;
a second source-side via cavity extending from the bottom surface of the contiguous dielectric material layer to the top surface of the contiguous dielectric material layer;
a second drain-side via cavity extending from the bottom surface of the contiguous dielectric material layer to the top surface of the contiguous dielectric material layer;
a raised source region located within the second source-side via cavity; and
a raised drain region located within the second drain-side via cavity;
wherein:
a periphery of the first source-side via cavity that is in contact with the top surface of the first doped semiconductor well is laterally offset from the gate spacer by a first portion of the contiguous dielectric material layer which contacts an upper surface of the first doped semiconductor well;
a periphery of the first drain-side via cavity that is in contact with the top surface of the first doped semi- conductor well is laterally offset from the gate spacer by a second portion of the contiguous dielectric material layer which contacts the upper surface of the first doped semiconductor well;

the gate electrode and the gate dielectric comprise a first gate stack overlying the first doped semiconductor well;

the raised source region is an entirety of a second source-side epitaxial pillar structure;

the raised drain region is an entirety of a second drain-side epitaxial pillar structure;

the first source-side epitaxial pillar structure and the first drain-side epitaxial pillar structure have a greater thickness than the second source-side epitaxial pillar structure and the second drain-side epitaxial pillar structure;

the first doped semiconductor well has a doping of a first conductivity type;

the first source region and the first drain region have a doping of a second conductivity type that is the opposite of the first conductivity type;

the raised source region and the raised drain region have a doping of the opposite conductivity type with respect to the second doped semiconductor well;

the first source-side epitaxial pillar structure comprises a first source-extension region contacting the bottom surface of the first source region;

the first drain-side epitaxial pillar structure comprises a first drain-extension region contacting the bottom surface of the first drain region;

the first source-extension region and the first drain-extension region have a doping of a same conductivity type as the first source region and the first drain region; and a dopant concentration of the first source-extension region and the first drain-extension region is lower than a dopant concentration of the first source region and the first drain region.

2. The semiconductor structure of claim 1, wherein:

a dopant concentration of the first source-extension region and the first drain-extension region is lower than a dopant concentration of the first source region and the first drain region.

3. The semiconductor structure of claim 1, further comprising:

a first source-side metallic via structure located in the first source-side via cavity, overlying the first source-side epitaxial pillar structure, and having a top surface that is planar with the top surface of the contiguous dielectric material layer;

a first drain-side metallic via structure located in the first drain-side via cavity, overlying the first drain-side epitaxial pillar structure, and having a top surface that is planar with the top surface of the contiguous dielectric material layer;

a first source-side metal-semiconductor alloy portion contacting a top surface of the first source region and a bottom surface of the first source-side metallic via structure; and a first drain-side metal-semiconductor alloy portion contacting a top surface of the first drain region and a bottom surface of the first drain-side metallic via structure;

wherein:

the first source region has a horizontal cross-sectional shape that is entirely contained within a horizontal cross-sectional shape of the first source-side metallic via structure; and the first drain region has a horizontal cross-sectional shape that is entirely contained within a horizontal cross-sectional shape of the first drain-side metallic via structure.

4. The semiconductor structure of claim 1, wherein a top surface of the first doped semiconductor well and the top surface of the second doped semiconductor well are located within a same horizontal plane.

5. The semiconductor structure of claim 1, wherein the first source region, the first drain region, the raised source region, and the raised drain region comprise a same doped semiconductor material.

6. The semiconductor structure of claim 1, further comprising:

an embedded source region embedded within the second doped semiconductor well, located underneath a top surface of the substrate, and contacting a bottom surface of the raised source region; and an embedded drain region embedded within the second doped semiconductor well, located underneath the top surface of the substrate, and contacting a bottom surface of the raised drain region.

7. The semiconductor structure of claim 1, wherein:

each of the raised source region and the raised drain region has a greater horizontal cross-sectional area than any horizontal cross-sectional area of the first source region or the first drain region; and the first source region, the first drain region, the raised source region, and the raised drain region have a same composition.

8. The semiconductor structure of claim 1, wherein the first field effect transistor comprises a portion of a peripheral circuit of a NAND memory device.

9. The semiconductor structure of claim 8, wherein:

the NAND memory device comprises a vertical NAND device located over the substrate;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in the first device level and a second control gate electrode located in the second device level.

10. The semiconductor structure of claim 1, wherein the channel further comprises:
- a first raised channel region having a doping of the first conductivity type and located at a bottom portion of the first source-side via cavity and physically contacting a portion of the top surface of the surface portion of the channel;
- a second raised channel region having a doping of the first conductivity type and located at a bottom portion of the first drain-side via cavity and physically contacting another portion of the top surface of the surface portion of the channel.

11. A semiconductor structure comprising:
- a gate dielectric and a gate electrode overlying a channel of a first field effect transistor, wherein the channel comprises a surface portion of a first doped semiconductor well having a doping of a first conductivity type throughout and having a top surface located within a horizontal plane;
- a contiguous dielectric material layer laterally surrounding the gate electrode;
- a first source-side via cavity extending from a bottom surface of the contiguous dielectric material layer to a top surface of the contiguous dielectric material layer and adjoined to the top surface of the first doped semiconductor well;
- a first drain-side via cavity extending from the bottom surface of the contiguous dielectric material layer to the top surface of the contiguous dielectric material layer and adjoined to the top surface of the first doped semiconductor well;
- a first source-side epitaxial pillar structure located entirely within the first source-side via cavity, having a doping of a second conductivity type that is the opposite of the first conductivity type throughout, and including a first source region therein; and
- a first drain-side epitaxial pillar structure located entirely within the first drain-side via cavity, having a doping of the second conductivity type throughout, and including a first drain region therein, wherein:
- a first p-n junction is located between the channel and the first source-side epitaxial pillar structure;
- a second p-n junction is located between the channel and the first drain-side epitaxial pillar structure; and
- the first p-n junction and the second p-n junction are located entirely above, and are vertically spaced from, the horizontal plane including the top surface of the first doped semiconductor well, further comprising a second field effect transistor that comprises:
- a second doped semiconductor well located in the substrate;
- a second gate stack comprising another gate dielectric and another gate electrode and overlying the second doped semiconductor well, the second doped semiconductor well comprising a channel of the second field effect transistor;
- a second source-side via cavity extending from the bottom surface of the contiguous dielectric material layer to the top surface of the contiguous dielectric material layer;
- a second drain-side via cavity extending from the bottom surface of the contiguous dielectric material layer to the top surface of the contiguous dielectric material layer;
- a raised source region located within the second source-side via cavity; and
- a raised drain region located within the second drain-side via cavity;

wherein:
- the raised source region is an entirety of a second source-side epitaxial pillar structure;
- the raised drain region is an entirety of a second drain-side epitaxial pillar structure;
- the first source-side epitaxial pillar structure and the first drain-side epitaxial pillar structure have a greater thickness than the second source-side epitaxial pillar structure and the second drain-side epitaxial pillar structure;
- the first doped semiconductor well has a doping of a first conductivity type;
- the first source region and the first drain region have a doping of a second conductivity type that is the opposite of the first conductivity type;
- the raised source region and the raised drain region have a doping of the opposite conductivity type with respect to the second doped semiconductor well;
- the first source-side epitaxial pillar structure comprises a first source-extension region contacting the bottom surface of the first source region;
- the first drain-side epitaxial pillar structure comprises a first drain-extension region contacting the bottom surface of the first drain region;
- the first source-extension region and the first drain-extension region have a doping of a same conductivity type as the first source region and the first drain region; and
- a dopant concentration of the first source-extension region and the first drain-extension region is lower than a dopant concentration of the first source region and the first drain region.

12. The semiconductor structure of claim 11, wherein a top surface of the first doped semiconductor well and the top surface of the second doped semiconductor well are located within a same horizontal plane, and wherein the first source region, the first drain region, the raised source region, and the raised drain region comprise a same doped semiconductor material.

* * * * *